(12) United States Patent
Urzhumov

(10) Patent No.: US 10,938,115 B2
(45) Date of Patent: Mar. 2, 2021

(54) RESONANCE-FREQUENCY DIVERSE METAMATERIALS AND METASURFACES

(71) Applicant: Elwha, LLC, Bellevue, WA (US)

(72) Inventor: Yaroslav A. Urzhumov, Bellevue, WA (US)

(73) Assignee: Elwha, LLC, Bellevue, WA (US)

( * ) Notice: Subject to any disclaimer, the term of this patent is extended or adjusted under 35 U.S.C. 154(b) by 12 days.

(21) Appl. No.: 16/361,147

(22) Filed: Mar. 21, 2019

(65) Prior Publication Data

US 2020/0303828 A1 Sep. 24, 2020

(51) Int. Cl.
| | |
|---|---|
| *H01Q 15/00* | (2006.01) |
| *H01Q 3/26* | (2006.01) |
| *H03H 9/17* | (2006.01) |
| *H01Q 9/04* | (2006.01) |
| *H01Q 3/46* | (2006.01) |

(Continued)

(52) U.S. Cl.
CPC .......... *H01Q 15/0086* (2013.01); *H01Q 3/26* (2013.01); *H01Q 3/46* (2013.01); *H01Q 9/0442* (2013.01); *H01Q 15/008* (2013.01); *H03H 9/171* (2013.01); *H04B 7/0456* (2013.01); *H04B 7/0617* (2013.01)

(58) Field of Classification Search
CPC ........ H01Q 15/0086; H01Q 3/26; H01Q 3/46; H01Q 15/008; H01Q 9/0442; H04B 7/0456; H04B 7/0617; H03H 9/171
USPC ....... 333/125, 126, 128, 134, 135, 136, 137, 333/156–161
See application file for complete search history.

(56) References Cited

U.S. PATENT DOCUMENTS

| | | |
|---|---|---|
| 4,114,592 A | 9/1978 | Winston |
| 4,390,243 A | 6/1983 | Hammerschlag |
| 5,208,653 A | 5/1993 | Mark et al. |

(Continued)

FOREIGN PATENT DOCUMENTS

| | | |
|---|---|---|
| WO | 03-058809 A2 | 7/2003 |

OTHER PUBLICATIONS

PCT International Search Report; International App. No. PCT/US2019/049300; dated Dec. 20, 2019; pp. 1-4.

(Continued)

*Primary Examiner* — Robert J Pascal
*Assistant Examiner* — Jorge L Salazar, Jr.
(74) *Attorney, Agent, or Firm* — Phillips Winchester; Justin K. Flanagan

(57) ABSTRACT

A beamforming system, comprising a plurality of subsets of tunable resonator elements arranged on a substrate. Each subset of tunable resonator elements comprises at least two resonator elements that have a common resonance property modifiable by a common physical stimulus. A first control input may provide a first physical stimulus to modify the resonance property of all the tunable resonator elements in a first subset of tunable resonator elements. A second control input may provide a second physical stimulus to modify the resonance property of all the tunable resonator elements in a second subset of tunable resonator elements. A controller adjusts the first and second physical stimulus provided via the control inputs between a plurality of physical stimulus values. Each different physical stimulus value corresponds to one of a plurality of a unique resonance patterns and associated unique radiation patterns.

43 Claims, 23 Drawing Sheets

(51) Int. Cl.
*H04B 7/0456* (2017.01)
*H04B 7/06* (2006.01)

(56) References Cited

U.S. PATENT DOCUMENTS

| | | |
|---|---|---|
| 5,280,557 A | 1/1994 | Nwasokwa |
| 6,657,580 B1 | 12/2003 | Edwards |
| 6,903,261 B2 | 6/2005 | Habraken et al. |
| 7,546,012 B2 | 6/2009 | Bratkovski et al. |
| 9,000,293 B2 | 4/2015 | Caparros |
| 9,581,762 B2 | 2/2017 | Wertsberger et al. |
| 9,780,853 B2 | 10/2017 | Urzhumov |
| 9,800,310 B2 | 10/2017 | Urzhumov |
| 9,967,011 B1 | 5/2018 | Lipworth et al. |
| 10,056,698 B2 | 8/2018 | Tegreene |
| 10,218,067 B2 | 2/2019 | Black |
| 10,236,947 B2 | 3/2019 | Urzhumov |
| 10,236,955 B2 | 3/2019 | Urzhumov |
| 10,249,950 B1 | 4/2019 | Arnitz |
| 2002/0158798 A1 | 10/2002 | Chiang et al. |
| 2004/0109643 A1 | 6/2004 | Kim et al. |
| 2004/0162034 A1 | 8/2004 | Parker |
| 2006/0233492 A1 | 10/2006 | Schaafsma |
| 2007/0120439 A1 | 5/2007 | Kadota |
| 2007/0191064 A1 | 8/2007 | Skarby et al. |
| 2008/0048917 A1 | 2/2008 | Achour et al. |
| 2008/0052505 A1 | 2/2008 | Theobald |
| 2008/0054899 A1 | 3/2008 | Aksoy et al. |
| 2008/0204347 A1 | 8/2008 | Alvey et al. |
| 2008/0223443 A1 | 9/2008 | Benitez et al. |
| 2009/0213022 A1 | 8/2009 | Lier et al. |
| 2009/0284429 A1 | 11/2009 | Lier |
| 2010/0139739 A1 | 6/2010 | Ashkin |
| 2010/0301971 A1 | 12/2010 | Yonak et al. |
| 2012/0138047 A1 | 6/2012 | Ashkin |
| 2012/0212328 A1 | 8/2012 | Blair et al. |
| 2013/0135159 A1 | 5/2013 | Goebel |
| 2013/0208332 A1 | 8/2013 | Yu et al. |
| 2013/0266319 A1 | 10/2013 | Bodan et al. |
| 2014/0056378 A1 | 2/2014 | Harel et al. |
| 2014/0128032 A1 | 5/2014 | Muthukumar |
| 2014/0211298 A1 | 7/2014 | Sayyah et al. |
| 2014/0231627 A1 | 8/2014 | Wakatsuki et al. |
| 2014/0266946 A1 | 9/2014 | Bily et al. |
| 2014/0268436 A1 | 9/2014 | Du et al. |
| 2014/0306784 A1 | 10/2014 | Broyde et al. |
| 2015/0109181 A1 | 4/2015 | Hyde et al. |
| 2015/0162658 A1 | 6/2015 | Bowers et al. |
| 2015/0219806 A1 | 8/2015 | Arbabi |
| 2015/0301275 A1 | 10/2015 | Andle et al. |
| 2016/0013531 A1 * | 1/2016 | Casse .................. H01Q 3/36 333/161 |
| 2016/0044296 A1 | 2/2016 | Sun et al. |
| 2016/0099674 A1 | 4/2016 | Pan |
| 2016/0099675 A1 | 4/2016 | Wheelwright |
| 2016/0149312 A1 | 5/2016 | Henry et al. |
| 2016/0190698 A1 | 6/2016 | Andresen et al. |
| 2016/0239060 A1 | 8/2016 | Koob et al. |
| 2016/0327745 A1 | 11/2016 | Driscoll |
| 2017/0063344 A1 | 3/2017 | Broyde et al. |
| 2017/0069973 A1 | 3/2017 | Black |
| 2017/0163327 A1 | 6/2017 | Yang et al. |
| 2017/0229774 A1 | 8/2017 | Schuehler et al. |
| 2017/0346176 A1 | 11/2017 | Linn et al. |
| 2017/0351102 A1 | 12/2017 | Wertsberger |
| 2018/0006375 A1 | 1/2018 | Black |
| 2018/0006376 A1 | 1/2018 | Black |
| 2018/0062265 A1 | 3/2018 | Tegreene |
| 2018/0108987 A1 | 4/2018 | Sazegar et al. |
| 2018/0131103 A1 | 5/2018 | Bily et al. |
| 2018/0259757 A1 | 9/2018 | Urzhumov |
| 2019/0131704 A1 | 5/2019 | Urzhumov |

OTHER PUBLICATIONS

PCT International Application No. PCT/US2019/049300; International Search Report dated Dec. 20, 2019; pp. 1-4.
PCT International Patent Application No. PCT/US2020/023964; International Search Report and Written Opinion dated Jul. 10, 2020, 10 pp.
Elwha, LLC, PCT International Patent Application No. PCT/US2020/023954; International Search Report and Written Opinion dated Jul. 10, 2020, 11 pp.
U.S. Appl. No. 15/868,215, Non-Final Office Action dated May 21, 2020, 18 pp.
U.S. Appl. No. 16/868,215, Notice of Allowance dated Nov. 20, 2020, pp. 1-9.

* cited by examiner

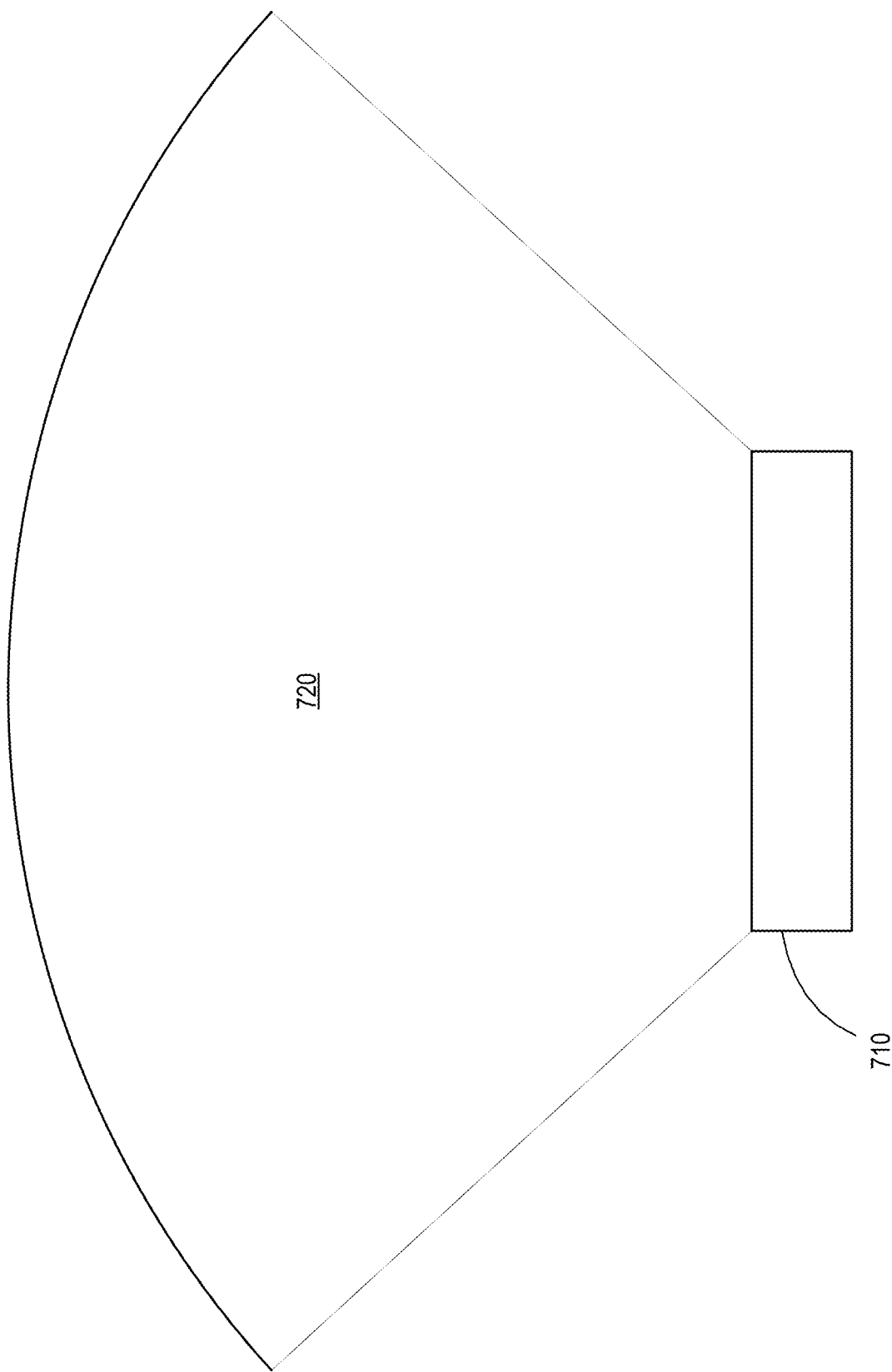

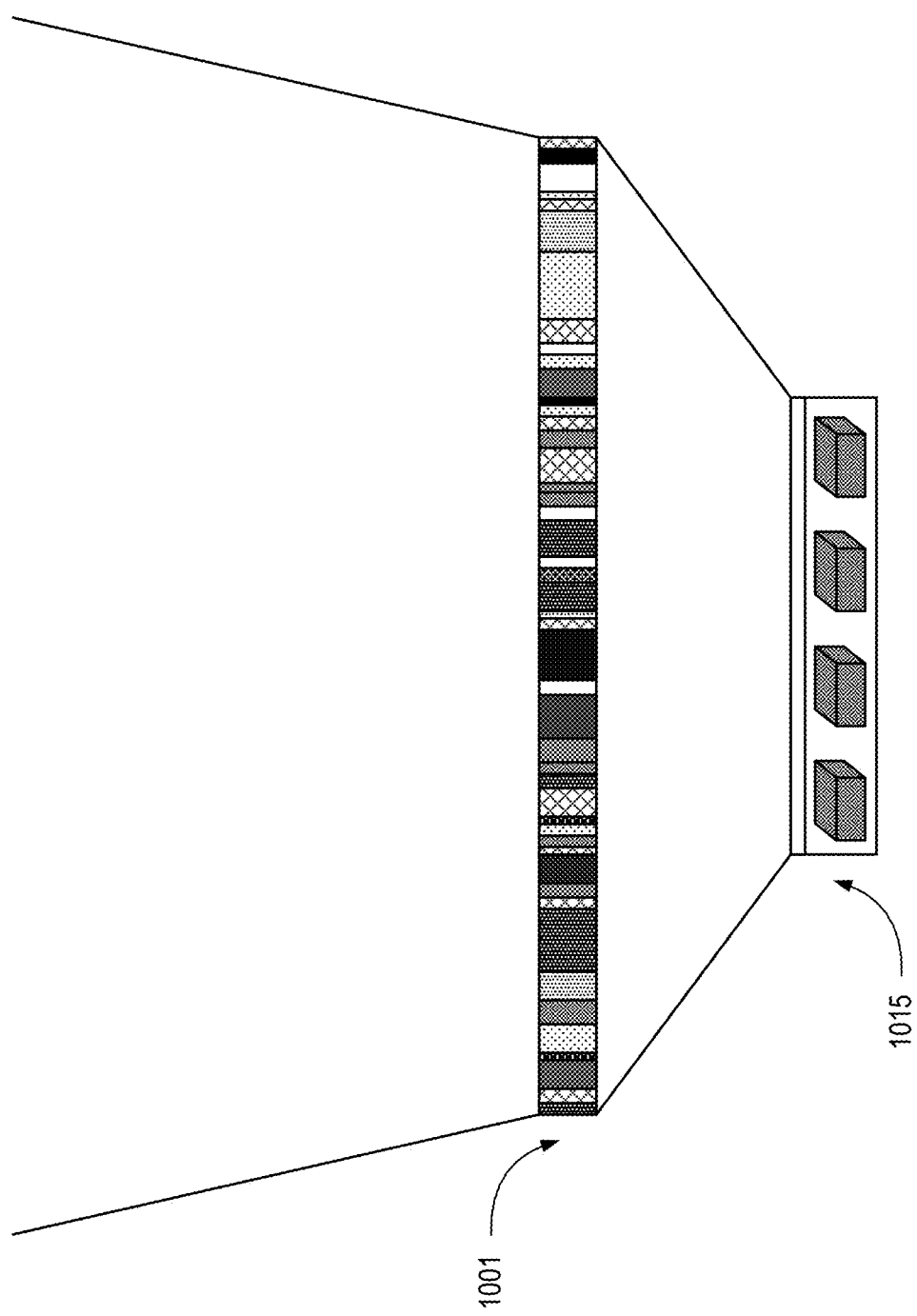

RESONANCE-FREQUENCY DIVERSE METAMATERIALS AND METASURFACES

If an Application Data Sheet (ADS) has been filed on the filing date of this application, it is incorporated by reference herein. Any applications claimed on the ADS for priority under 35 U.S.C. §§ 119, 120, 121, or 365(c), and any and all parent, grandparent, great-grandparent, etc., applications of such applications are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 U.S.C. § 119(e) for provisional patent applications, for any and all parent, grandparent, great-grandparent, etc., applications of the Priority Application(s)). In addition, the present application is related to the "Related Applications," if any, listed below.

PRIORITY APPLICATIONS

None

RELATED APPLICATIONS

This application hereby incorporates by reference in their entireties: U.S. patent application Ser. No. 14/918,331 filed on Oct. 20, 2015 titled "Tunable Metamaterial Systems and Methods;" U.S. patent application Ser. No. 15/253,606 filed on Aug. 31, 2016 titled "Tunable Medium Linear Coder;" U.S. patent application Ser. No. 15/409,401 filed on Jan. 18, 2017 titled "Tunable Medium Linear Coder;" U.S. patent application Ser. No. 15/048,878 filed on Feb. 19, 2016 titled "Transmitter Configured to Provide a Channel Capacity that Exceeds a Saturation Channel Capacity;" U.S. patent application Ser. No. 15/048,880 filed on Feb. 19, 2016 titled "Receiver Configured to Provide a Channel Capacity that Exceeds a Saturation Channel Capacity;" U.S. patent application Ser. No. 15/048,884 filed on Feb. 19, 2016 titled "System with Transmitter and Receiver Remote From One Another and Configured to Provide a Channel Capacity that Exceeds a Saturation Channel Capacity;" U.S. patent application Ser. No. 15/048,888 filed on Feb. 19, 2016 titled "System with Transmitter and Receiver Configured to Provide a Channel Capacity that Exceeds a Saturation Channel Capacity;" U.S. patent application Ser. No. 15/345,251 filed on Nov. 7, 2016 titled Massively Multi-User MIMO Using Space-Time Holography;" U.S. patent application Ser. No. 15/409,394 filed on Jan. 18, 2017 titled Massively Multi-User MIMO Using Space-Time Holography;" U.S. patent application Ser. No. 15/706,697 filed on Sep. 16, 2017 titled "Systems and Methods for Reduced Control Inputs in Tunable Meta-Devices;" U.S. patent application Ser. No. 15/801,164 filed on Nov. 1, 2017 titled "Aperture Efficiency Enhancements Using Holographic and Quasi-Optical Beam Shaping Lenses;" and U.S. patent application Ser. No. 15/868,215 filed on Jan. 11, 2018 titled "Diffractive Concentrator Structures." Many of the embodiments and variations disclosed in the related applications can be used in combination with and/or by modification in view of the systems and methods disclosed herein.

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc., applications of the Priority Applications and the Related Applications, including any priority claims, is incorporated herein by reference to the extent such subject matter is not inconsistent herewith.

TECHNICAL FIELD

The present disclosure generally relates electromagnetic and acoustic beamforming via resonator elements.

BRIEF DESCRIPTION OF THE DRAWINGS

FIG. 7A illustrates an electromagnetic antenna system configured with subsets of resonator elements to selectively steer a beamform within a coverage area.

FIG. 10B illustrates an acoustic diffractive structure mapping acoustic radiation to an acoustic system comprises acoustic resonator elements, according to one embodiment.

DETAILED DESCRIPTION

Figure 1:
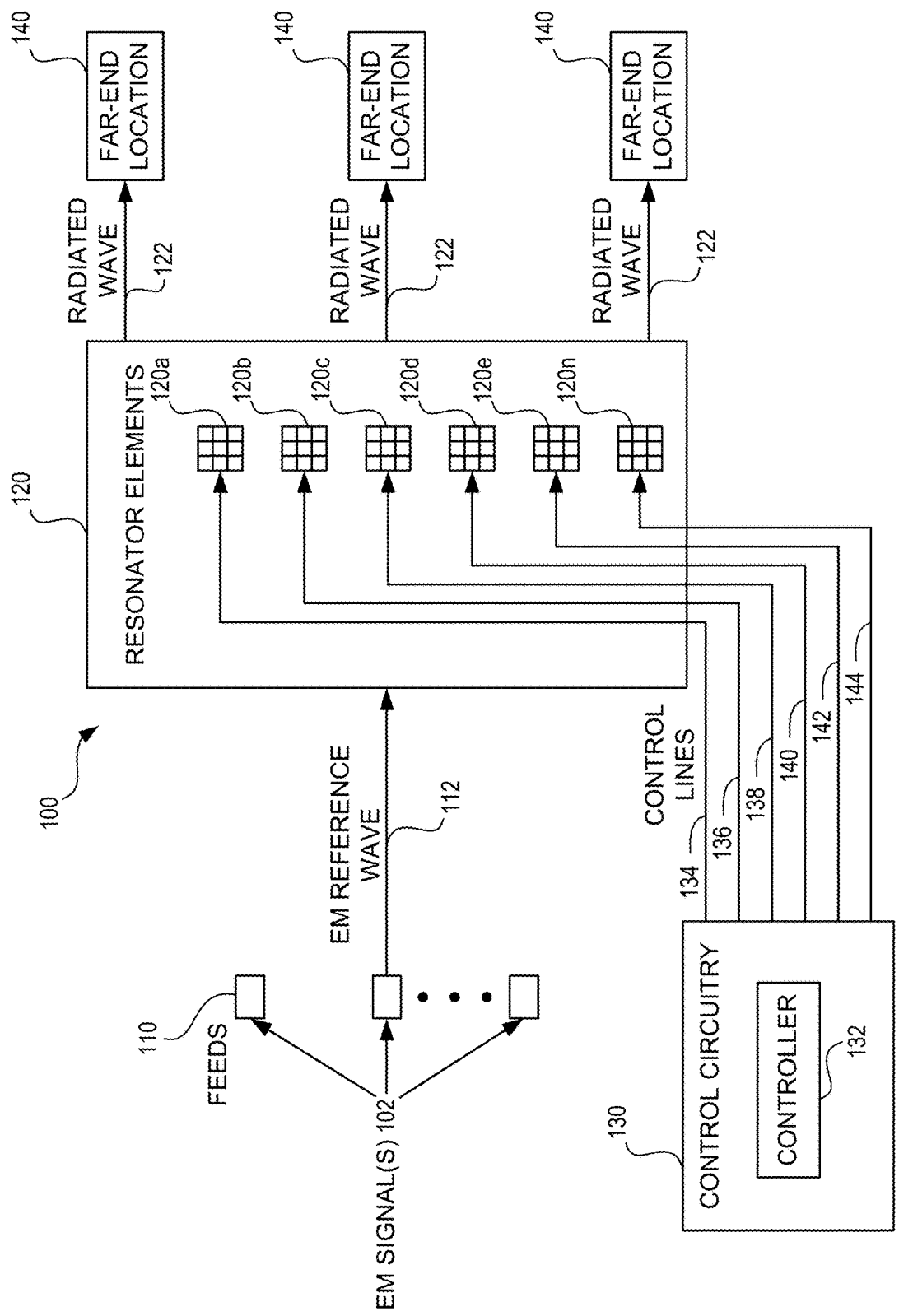
FIG. 1 is a simplified block diagram of an example electromagnetic antenna system, according to various embodiments.

The present disclosure provides various embodiments, systems, apparatuses, and methods that relate to acoustic and electromagnetic field patterning and beamforming. Electromagnetic field patterning may be useful for wireless power transfer, data transfer, control signal communication, and other purposes. Acoustic patterning may be useful for data transfer, imaging, control signal communication, and other purposes.

A generic example of using a narrow beamform in the electromagnetic space is a parabolic dish antenna system. By adding a gimble to the system, a controller may change the azimuth and/or elevation of the parabolic dish antenna system to service a wide coverage area with a plurality of distinct beamforms or radiation patterns. The relatively slow mechanical movement of the parabolic dish antenna system to adjust the azimuth and/or elevation limits its use and applicability for certain applications.

A phased array of antennas can allow for the generation of a plurality of distinct field patterns within a coverage area. A phased array includes multiple complete antennas each connected to a phase shifter. Thus, a phased array is many times larger than a single antenna and requires a common controller, power divider, and a phase shifter for each antenna in the array. The size and complexity of phased arrays limit their potential uses and general applicability to a small subset of practical applications.

Tunable metamaterial devices may be used to solve various electromagnetic field-based issues. By tuning individual elements of a densely-packed metamaterial array, a wide variety of customizable radiation patterns may be attained. In many instances, metamaterial elements are used as example embodiments of sub-wavelength antenna elements. It is, however, appreciated that any of a wide variety of sub-wavelength electromagnetic or acoustic elements may be utilized that may or may not be classified as metamaterials.

In various embodiments described herein, electromagnetic antenna elements and/or acoustic elements may operate on principles of resonance and so are generally referred to as "resonator elements," which encompasses electromagnetic resonator elements and acoustic resonator elements. Resonator elements may be used to send and/or receive radiation (e.g., acoustic or electromagnetic) within a coverage area (e.g., a three-dimensional space). In some implementations, it is useful to use beamforming to increase the selectivity of a system of resonator elements. Multiple, selectable beamforms may be used to attain a desired coverage area while still realizing the other advantages of beamforming.

In some of the approaches described in the related applications cited above, multiple tunable elements are arranged in a one-dimensional or two-dimensional array. Some of the approaches in the related applications contemplate having each tunable element individually controllable. Moreover, some of the approaches in the related applications contemplate electrically-tunable elements. The presently described systems and methods include variations of tunable, beamforming electromagnetic and acoustic systems with reduced control input complexity in which physical stimulus inputs are used to modify groups of tunable resonator elements.

For example, a beamforming system, may include a plurality of subsets of tunable resonator elements arranged on a substrate. Each subset of tunable resonator elements may include at least two resonator elements but may alternatively have tens or even thousands of resonator elements. As a specific example, a beamforming system may include 10,000 tunable resonator elements comprising 100 subsets of 100 resonator elements each. Each subset may be, for example, an N×M array of adjacent tunable resonator elements, where N and M are integers. Alternatively, individually tunable resonator elements of a subset may be, for example, randomly arranged on the substrate, arranged in rows, arranged in columns, or arranged according to a predefined distribution pattern.

The resonator elements of a subset may be modifiable by common physical stimulus that is controllable by a single control input. Thus, using the example system above that includes 10,000 resonator elements in 100 subsets of 100 resonator elements each may be fully tunable using 100 inputs that control 100 physical stimuli. In some embodiments, fewer than 100 inputs may be used to address and control the 100 physical stimuli.

A control input may control a physical stimulus to modify the resonance property of all the tunable resonator elements in a subset of tunable resonator elements. A controller may control the modifications to the first physical stimulus. For example, a controller may apply different physical stimulus values to each subset of resonator elements. The controller may, in some embodiments, select between two possible physical stimulus values. In other embodiments, the controller may select a physical stimulus value from many discrete values. In still other embodiments, the controller may select a physical stimulus value between a range of physical stimulus values. In each of these embodiments, each different physical stimulus value corresponds to one of a plurality of a unique resonance patterns and associated unique radiation patterns of the subset of resonator elements. Accordingly, each unique pattern of physical stimulus values applied to a plurality of subsets of resonator elements corresponds to a unique beamform.

In some embodiments, the resonator elements are arranged with subwavelength inter-element spacings at an operational frequency. For example, the spacing between adjacent resonator elements may be smaller than the smallest wavelength in an operational bandwidth of the system. Each resonator element within a given subset of resonator elements may have a unique resonance for a given physical stimulus value of the first control input. Each subset of resonator elements may be associated with a unique resonance for a given physical stimulus, and each resonator element in a given subset of resonator elements may have a substantially similar resonance for a given physical stimulus.

At least some of the unique radiation patterns attainable by the system are linearly independent within the operational bandwidth. In some embodiments, the physical stimulus may be a common physical stimulus applied to all the resonator elements. A unique control input may be assigned to each subset of resonator elements to provide a unique physical stimulus to each subset of resonator elements. Assuming a minimum of at least two resonator elements in each subset of resonator elements, the number of control inputs would be at most half the number of resonator elements.

As previously noted, a subset of resonator elements may comprise contiguous resonator elements, a row of resonator elements, a hexagonal grouping of resonator elements, a rectangular grouping of resonator elements. In some embodiments, a subset of resonator elements may comprise a plurality of resonator elements interspersed between resonator elements that are part of a different subset.

Physical stimuli applied to subsets of resonator elements may comprise electric voltages applied directly to resonator elements to change resonant properties thereof. Alternatively, an electric voltage may be applied to modify a dielectric constant parameter of a dielectric material associated with the resonator elements in the subset. A controller may apply a sequence of electric voltage values to one or more subsets of resonator elements to produce a sequence of unique radiation patterns. A sequence of radiation pattern may, for example, be used for target code aperture imaging. The sequence of radiation patterns may be selected to correspond to a curved pattern, a spiral pattern, a zigzag pattern, and/or a raster-scan of a target region. The sequence of radiation patterns may be continuous where each of the unique radiation patterns overlap each other.

As an example, an electromagnetic embodiment may include subsets of resonator elements that are each associated with a mechanically deformable capacitor. For example, plates of a deformable capacitor may be deformed in response to a control input that changes the capacitance thereof. For instance, a control input may manipulate a mechanically deformable material between first and second conductive layers of a capacitor.

As another example, a control input may comprise an actuator to provide a mechanical actuation that changes a dimension of a mechanically deformable material associated with a subset of resonator elements. The mechanically deformable material may change capacitance or inductance in response to the deformation. In some embodiments, the control input may provide a physical stimulus as an adjustable electrical bias to resonator elements in a subset of resonator elements. In some embodiments, a control input may provide a physical stimulus in the form of a magnetic field applied to the resonator elements in a subset of resonator elements. In some embodiments, a control input may cause a mechanical deformation of at least a portion of each resonator element in the first subset of resonator elements.

In one embodiment, a control input may be embodied as a transducer that selectively deforms portions of the resonators in a subset of resonator elements. Alternatively, the transducer may selectively deform a common device or element connected to all the resonator elements in a subset of resonator elements. In such an embodiment, a plurality of transducers may each be connected to unique subsets of resonator elements in a system, such that the number of transducers is equal to the number of subsets of resonator elements. A transducer may cause a mechanical deformation at a frequency at least a magnitude higher than an operational frequency of the system.

A control input may be embodied as a mechanical actuator to mechanically adjust a component of each of the resonator elements in a subset of resonator elements to change a resonance property thereof. For example, the mechanical actuator may adjust a capacitance value of a common capacitor connected to all the resonator elements in the subset of resonator elements. In some embodiments, a substrate comprises a capacitive substrate on which the resonator elements are positioned. A control input may provide a physical stimulus to modify a capacitance of the substrate. In other embodiments, multiple control inputs may selectively modify capacitance values of portions of the substrate associated with different subsets of resonator elements.

For example, an electrical input may provide a physical stimulus to modify the capacitance of the substrate. In another embodiment, a thermal input may provide a physical stimulus to modify the capacitance of the substrate. In yet another embodiment, a mechanical input may provide a physical stimulus to modify the capacitance. In still another embodiment, an ultrasonic input may provide a physical stimulus to modify the capacitance of the substrate. In some embodiments, any of the above described input types may be used to modify a capacitance (as described) and/or an inductance in electromagnetic embodiments. In acoustic embodiments, any of the above described input types may be used to modify a bulk modulus, density, shear modulus or other acoustic property of the substrate to modify the acoustic resonance of acoustic resonator elements.

In one electromagnetic embodiment, the control input may modify a physical gap between charged plates that are part of or connected to the substrate. In other embodiments, the substrate may comprise a deformable material that, when deformed in response to one or more control inputs, modifies one or more resonance properties of the resonator elements of one or more subsets of resonator elements. As another example, control inputs may impart a uniform (or alternatively a non-uniform) compressive force to deform or otherwise mechanically alter the resonator elements of one or more subsets of resonator elements.

A controller may use a look-up-table to map the various control input values associated with a plurality of subsets of resonator elements to different radiation patterns. A target radiation pattern can be attained by setting the control inputs to a specific pattern. As previously noted, each subset of resonator elements may be associated with a single tunable element responsive to a physical stimulus. Many of the embodiments described herein may be implemented by directly modifying a physical property of the resonator elements in a subset of resonator elements or by modifying one or more common tunable elements associated with each subset of resonator elements.

Control inputs may be associated with rows and columns of resonator elements. Control inputs may be embodied as phase shifters (e.g., adjustable phase shifters) that alter a resonance property of resonator elements in a subset of resonator elements. In one embodiment of an acoustic system, the resonator elements comprise ultrasonic microresonators or, more generally, as acoustically resonant microparticles. In still other embodiments, the resonator elements comprise nanoparticles or nanocubes that function as RF nano-resonators or plasmonic nanoparticles for optical nano-resonators.

While resonator elements may be connected directly to one another or not physically secured at all, many embodiments utilize a substrate to maintain the resonator elements in a predefined arrangement. The substrate may be, for example, a dielectric or metallic layer. The resonator elements may be selectively placed or attached to the substrate in an ordered way. In another embodiment, resonator elements may be chemically grown on the substrate or deposited randomly through a mechanical or chemical process. For example, a system may comprise resonator elements that are nano-lithographically fabricated.

The control inputs may be used to modify one or more resonance properties of the respective subsets of resonator elements. Some specific examples of modifiable resonance properties of resonator elements include, without limitation, a modifiable resonance frequency, a modifiable resonance strength, a modifiable resonance damping rate, or other resonance property. An example of a suitable resonator element is a Lorentzian resonator.

In another embodiment, a physical stimulus modifies a reactance load parameter associated with each of the resonator elements in a subset of resonator elements. The resonator elements may be, for example, antenna elements with electromagnetic resonances. The spacing between adjacent resonator elements may be subwavelength with a spacing less than half of the smallest wavelength of an operating frequency band. The frequency band may comprise an RF spectrum, infrared spectrum, a visible spectrum, or combination thereof. Examples of possible frequency bands include a microwave frequency band, a bandwidth of frequencies between 300 GHz and 3000 GHz, a portion of a millimeter (mm) frequency band (e.g., between 40 GHz and 300 GHz), etc. A millimeter frequency band may be used to implement millimeter wave (mmW) imaging.

In other embodiments, the resonator elements may be optical resonator elements. In various embodiments, optical resonator elements may be randomly arranged on the substrate, arranged in concentric rings, arranged in a one-dimensional array, or arranged in a two-dimensional array. The optical resonator elements may, for example, be plasmonic optical resonators, semiconductor-based optical resonators, and/or dielectric optical resonators. Optical resonator elements may be coupled to a discrete resonance-tunable electroactive optical medium or a common resonance-tunable electroactive optical medium. For example, a subset of resonator elements may be coupled to a common resonance-tunable electroactive optical medium, such as a liquid crystal that is tunable via a single adjustable control input or an electroactive polymer tunable via a single adjustable control input. In another example, the common resonance-tunable electroactive optical medium may be a semiconductor-metal junction that is tunable via a single adjustable control input. In another example, the common resonance-tunable electroactive optical medium may be a semiconductor-semiconductor junction that is tunable via a single adjustable control input.

In any of the embodiments described above, or combinations thereof, each subset of optical resonator elements may be coupled to a common resonance-tunable electroactive optical medium. In other embodiments, resonator elements may have elements with acoustic resonances, such as ultrasonic acoustic resonances. In various acoustic embodiments, an input may provide a physical stimulus that modifies a bulk modulus of an acoustic medium associated with each of the resonator elements in a subset of resonator elements. The modified bulk modulus alters the acoustic resonance properties of the resonator elements within the subset of resonator elements. Alternatively or additionally, the input may provide a physical stimulus that modifies a shear modulus or density of an acoustic medium associated with each of the resonator elements in the first subset of resonator elements.

As in other embodiments, the input that provides the physical stimulus may be an electrical input, thermal input, mechanical input, ultrasonic input, and/or combination thereof. For instance, the input may be a single electrical input that modifies one or more of a capacitance, an inductance, and a dielectric constant of each of the resonator elements in the first subset of resonator elements or tunable element(s) commonly associated therewith. In some embodiments, the resonator elements may be part of an anisotropic metamaterial. Control inputs may modify tensorial properties of the anisotropic metamaterial.

In some embodiments, a control input may provide a variable voltage bias to a subset of resonator elements to implement a coded aperture by sweeping the voltage bias between a first voltage and a second voltage (e.g., an analog sweep or in discrete steps). A controller of the system may sweep the bias voltages of numerous control inputs, each associated with a unique subset of resonator elements, to generate a sequence of beams. In some embodiments, the sequence of beams may be randomly distributed in three-dimensional space or steer along a two-dimensional path. In other embodiments, the beam steering may implement a raster scan on a two-dimensional plane.

Sweeping a bias voltage, temperature, acoustic property, or other physical stimulus from an initial value to a final value may be preferred or more practical than selecting discrete, noncontiguous physical stimulus values. For example, it may be more practical to sweep a temperature value from an initial temperature value to a final temperature value. It may be impractical to select noncontiguous temperature values. A diffractive structure having an aperture larger than a two-dimensional area of the resonator elements arranged on the substrate may be used to map the beamforms of the resonator elements to target beamforms. As on example, sweeping a physical stimulus value may produce a base set of beamforms of varying shapes and steering angles. A diffractive structure may map the base set of beamforms to a target set of beamforms having target beam shapes and/or steering angles.

A diffractive structure may diffractively concentrate incident radiation onto a sub-portion (i.e., less than all the resonator elements). The diffractive structure may comprise a three-dimensional distribution of subwavelength features to diffract electromagnetic or acoustic radiation.

The diffractive structure may, for example, map incident radiation from angles between zero and a theoretical maximum acceptance angle given by $$\sin^{-1}\left(\sqrt{\frac{\Sigma}{S}}\right),$$

where S is an area of the diffractive structure aperture and Σ is the two-dimensional area of the portion of the resonator elements between which the radiation is mapped. In a receiving mode, the diffractive structure may receive incident radiation from angles between approximately one-half of the theoretical maximum acceptance angle and diffractively concentrate the radiation onto at least some of the resonator elements. The diffractive structure may operate with the opposite effect in a transmit mode. The diffractive structure may be reflective or transmissive as a whole and may comprise reflective and/or transmissive voxels arranged as a three-dimensional volume. Metamaterials may be utilized in some embodiments to attain target reflective and/or refractive properties for electromagnetic or acoustic radiation within an operational bandwidth. The diffractive structure may function as a static precoder, such as a linear precoder to covert between each of the unique radiation patterns of the resonator elements and each of a set of target radiation patterns on a 1:1 basis.

The system may include a static precoder as a volumetric distribution of metamaterials or materials having varying densities to convert between the unique radiation patterns produced by the resonator elements and a set of target radiation patterns to implement acoustic multiple-Input and Multiple-Output (MIMO) between spatial locations and subsets of resonator elements.

In such an embodiment, acoustic waves from each of a plurality of spatial locations with target fields of view may be mapped to subsets of the resonator elements to provide three-dimensional localization of received acoustic waves. Each of the subsets of resonator elements may include a plurality of resonator elements in a one-dimensional array, a two-dimensional array, in an aperiodic distribution, in a random distribution, or other arrangement as described herein. In acoustic embodiments, the static precoder may comprise a distribution of materials having varying shear moduli, densities, bulk moduli, or other acoustic property to convert between the unique radiation patterns and the set of target radiation patterns.

Resonator elements, as described in conjunction with and incorporated into many of the embodiments herein, may function as "antenna" resonator elements in electromagnetic embodiments and their analogous radiating elements in ultrasonic and other acoustic embodiments. The terms radiating, radiation pattern, beam shaping, beam steering, operating, etc., as used in conjunction with a system of resonator elements or as used in conjunction with an individual resonator element are understood in the context of the principle of T-symmetry or time reversal symmetry as it applies to electromagnetics and linear acoustics.

For example, antenna resonator elements in electromagnetic embodiments may be described as operating, radiating, functioning, beamforming, beam steering, etc. within the context of the fundamental understanding of antenna reciprocity. For instance, characteristics of an antenna element or system of antenna elements, such as gain, resonant frequency, polarization, etc. are the same whether the antenna is transmitting or receiving. The same principles are applicable to acoustic systems, including ultrasonic acoustic systems with ultrasonic resonator elements. Accordingly, the variously described embodiments of individual resonator elements, subsets of resonator elements, and systems of resonator elements should be understood to encompass both transmit and receive modes, as well as simultaneous and time-multiplexed combinations thereof.

FIG. 1 is a simplified block diagram of an example electromagnetic antenna system 100, according to various embodiments. The electromagnetic antenna system 100 includes one or more feeds 110 configured to receive one or more electromagnetic signals 102 and propagate an electromagnetic reference wave 112 to a plurality of resonator elements 120 of the antenna system 100. As illustrated, the resonator elements are arranged in "subsets" 120a-120n and each subset has a common control line 134-144. Each control line of each subset selectively provides a physical stimulus to modify a resonance property of the resonator elements in a particular subset 120a-120n groupings referred to herein as "subsets." The block diagram shows six subsets 120a-120n that appear to each contain nine adjacent resonator elements; however, it is appreciated that the antenna system 100 may include tens, hundreds, or even thousands of subsets that may each have tens, hundreds or thousands of resonator elements that are commonly tuned by modification of a physical stimulus provided by a single control line.

As previously described, the plurality of resonator elements 120 may be spaced at sub-wavelength distances (e.g., at less than a half-wavelength of an operational frequency, at less than a quarter-wavelength of the operational frequency, etc.). Each subset of resonator elements 120a-120n may be configured to operate in at least two different operational states and may have a nonlinear resonance response to tuning. The resonator elements 120 are configured to selectively scatter the electromagnetic reference wave as a radiated wave 122. As used herein, the term "operational frequency" refers to a fundamental frequency of the radiated wave in freespace (e.g., through the air or void).

The antenna system 100 also includes control circuitry 130 including a controller 132 operably coupled to the plurality of resonator elements 120 by a plurality of control lines 134-144. In some embodiments, the controller 132 can be used to modulate the radiated wave 122 over time to deliver a plurality of different information streams to a plurality of different far-end locations 140. Accordingly, in some embodiments, an information stream from the radiated wave 122 received at one far-end locations 140 may be different from an information stream from the radiated wave 122 received at a different far-end location.

Figure 2A:
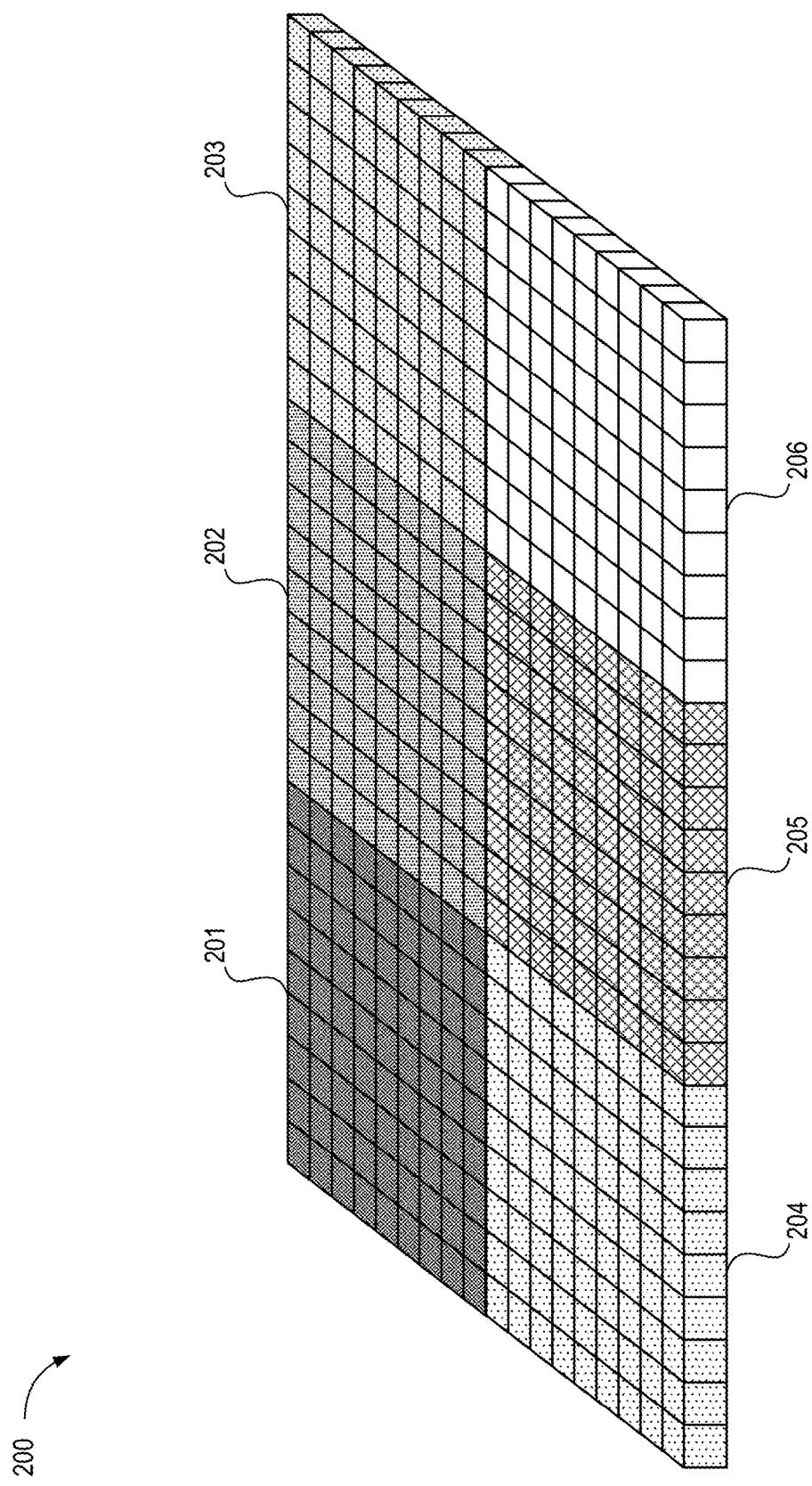
FIG. 2A is a simplified example of an acoustic or electromagnetic system with six subsets of resonator elements arranged in a two-dimensional array, according to one embodiment.

FIG. 2A is a simplified example of an acoustic or electromagnetic system 200 showing six subsets 201-206 of resonator elements arranged in a two-dimensional array. Each subset 201-206 may be connected to a common tunable element that can be selectively modified by a physical stimulus to change a resonance property of all the resonator elements within the subset. Thus, in the simplified example, six tunable elements may be controlled by, for example, six control inputs to selectively provide physical stimuli to modify a resonance property of the resonator elements within each respective subset 201-206 of resonator elements.

A feed layer, not shown, may feed an electromagnetic or acoustic signal to (or from) each of the resonator elements. The phase and amplitude of transmission between freespace and the feed is varied based on the modified resonance property. In the illustrated embodiment, the resonator elements of each subset 201-206 are grouped in two-dimensional arrays (illustrated as a simplified 9×9 array in each subset).

Figure 2B:
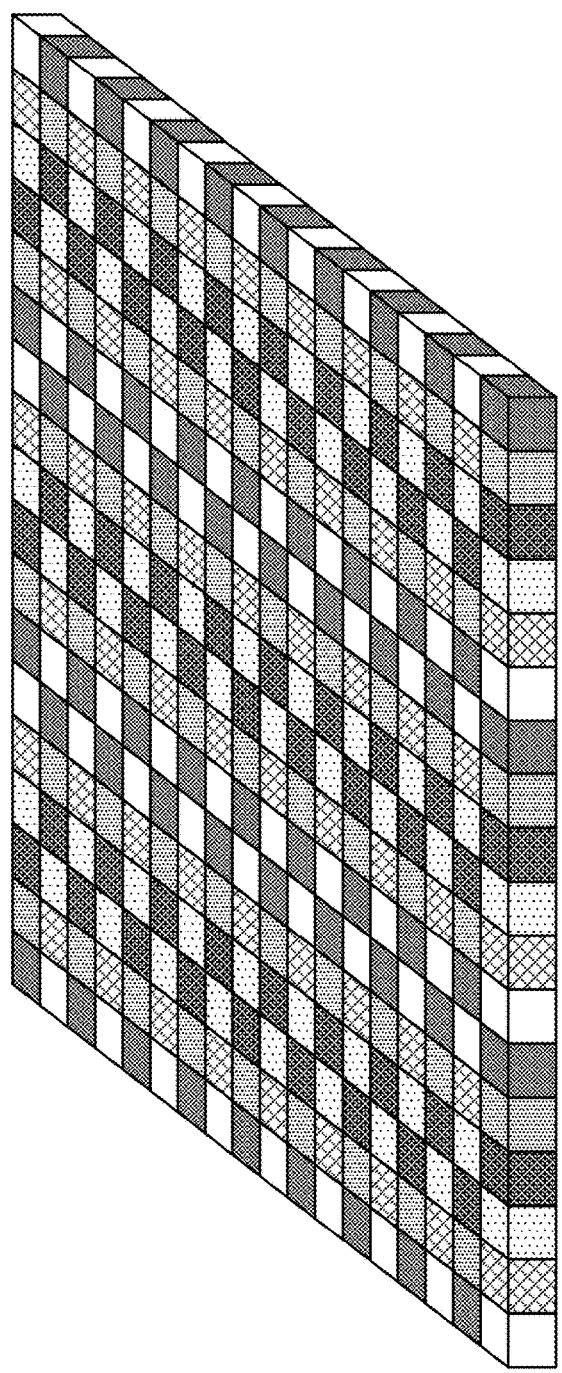
FIG. 2B illustrates an example of a system with six subsets of resonator elements arranged in a different pattern, according to one embodiment.

FIG. 2B illustrates an example of a system 210 with six subsets of resonator elements identifiable by their shading, which is similar to what is shown in FIG. 2A. However, as illustrated the resonator elements of each subset are not contiguous, but rather distributed according to a predefined pattern. Again, each unique subset may be connected to a common tunable element or elements that can be selectively modified by a physical stimulus from a single input to change a resonance property of all the resonator elements within each respective subset.

Figure 2C:
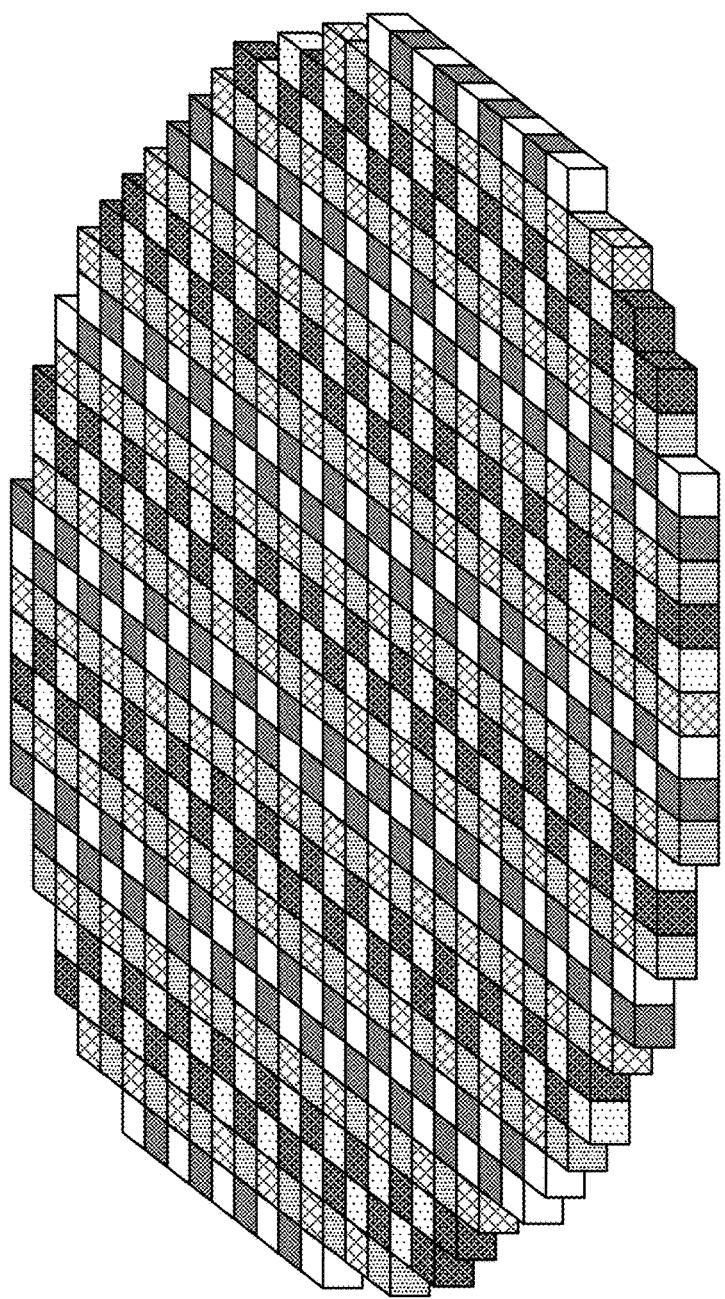
FIG. 2C illustrates another embodiment of a system in which the subsets of resonator elements are distributed according to a predefined pattern to form an aperture approximately an oval, according to one embodiment.

FIG. 2C illustrates another embodiment of a system 220 in which the subsets of resonator elements are distributed according to a predefined pattern to form an aperture approximately an oval. In various embodiments, hundreds of subsets may be utilized that each included hundreds of resonator elements, such that the edges of the oval would appear more rounded.

Figure 2D:
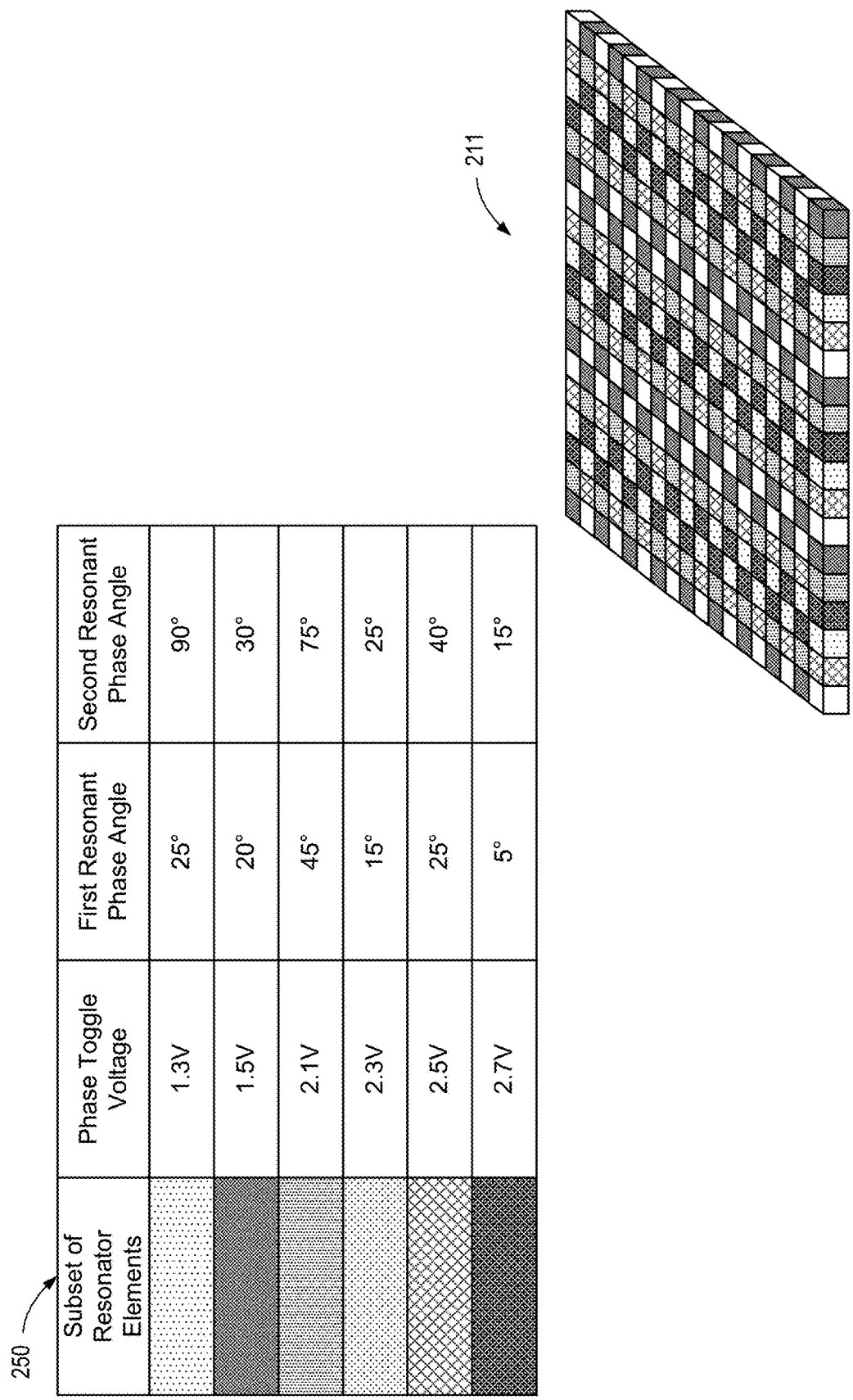
FIG. 2D illustrates an embodiment of a system in which each resonator element in a given subset is toggled between a first resonant phase angle and a second resonant phase angle based on an applied phase-toggle voltage, according to one embodiment.

FIG. 2D illustrates an embodiment of a system 211 in which each resonator element in a given subset is toggled between a first phase angle and a second phase angle based on an applied phase-toggle voltage. A table 250 shows the phase-toggle voltage of resonator elements of each specific subset (identified by different shading) and the corresponding first and second phase angles.

As illustrated, a plurality of resonator elements may be configured with a unique phase-toggle bias range to operate (e.g., transmit and/or receive radiation) at a first phase angle at bias voltages below the phase-toggle bias range and operate (e.g., transmit and/or receive radiation) at a second phase angle at bias voltages above the phase-toggle bias range. In such an embodiment, a single control input or a reduced number of control inputs may be used to apply an adjustable bias voltage.

A controller may adjust the bias voltage applied by the one or more control inputs to select a combination of resonator elements operating (e.g., receiving and/or transmitting radiation) at the first resonant phase angle and the remainder of the resonator elements operating at the second resonant phase angle. For a given applied voltage, some of the resonator elements will operate at the first phase angle due to the applied bias voltage being below their respective unique phase-toggle bias ranges, while others of the resonator elements will operate at the second phase angle due to the applied bias voltage being above their respective unique phase-toggle bias ranges. While only six examples of shading are used to show resonator elements having six different phase-toggle voltage levels, it is appreciated that any number of resonator elements having distinct phase-toggle voltage levels may be utilized. representing the different resonator elements.

Each unique combination of resonator elements operating at the first and second phase angles corresponds to a unique radiation pattern of the resonators. Accordingly, target beam shapes and beam steering angles may be achieved by selecting a specific phase-toggle voltage that will cause some resonators to operate at the first phase angle and others to operate at the second phase angle.

In some embodiments, every resonator element in the system 211 may have a unique phase-toggle voltage. In other embodiments (as illustrated), each subset of resonator elements may have a unique phase-toggle voltage but operate at common first and second phase angles depending on the applied voltage. In still other embodiments, each resonator element in a subset may have the same phase-toggle voltage but different first and second resonant phase angles. A controller may apply a specific voltage to a single control input impacting all the resonator elements. Alternatively, a controller may apply selective voltage values via a plurality of control inputs, where each control input is associated with a subset of resonator elements.

A system may, for example, include a plurality of resonator elements that are each configured with a unique phase-toggle threshold range to operate at a first phase angle at stimulus inputs below the phase-toggle threshold range and operate at a second phase angle at stimulus inputs above the phase-toggle threshold range. The stimulus inputs may be voltage inputs, thermal inputs, acoustic inputs, pressure inputs, based on mechanical deformation, expansion of mechanical elements, contraction of mechanical elements, etc.

In such embodiments, even a single control input may apply an adjustable physical stimulus to all the resonator elements. Alternatively, a single control input may apply an adjustable physical stimulus to all the resonator elements in each subset of resonator elements. Either way, a controller may adjust the magnitude of the physical stimulus(i) to select a combination of resonator elements operating at the first and second phase angles to select a unique radiation pattern.

Figure 3:
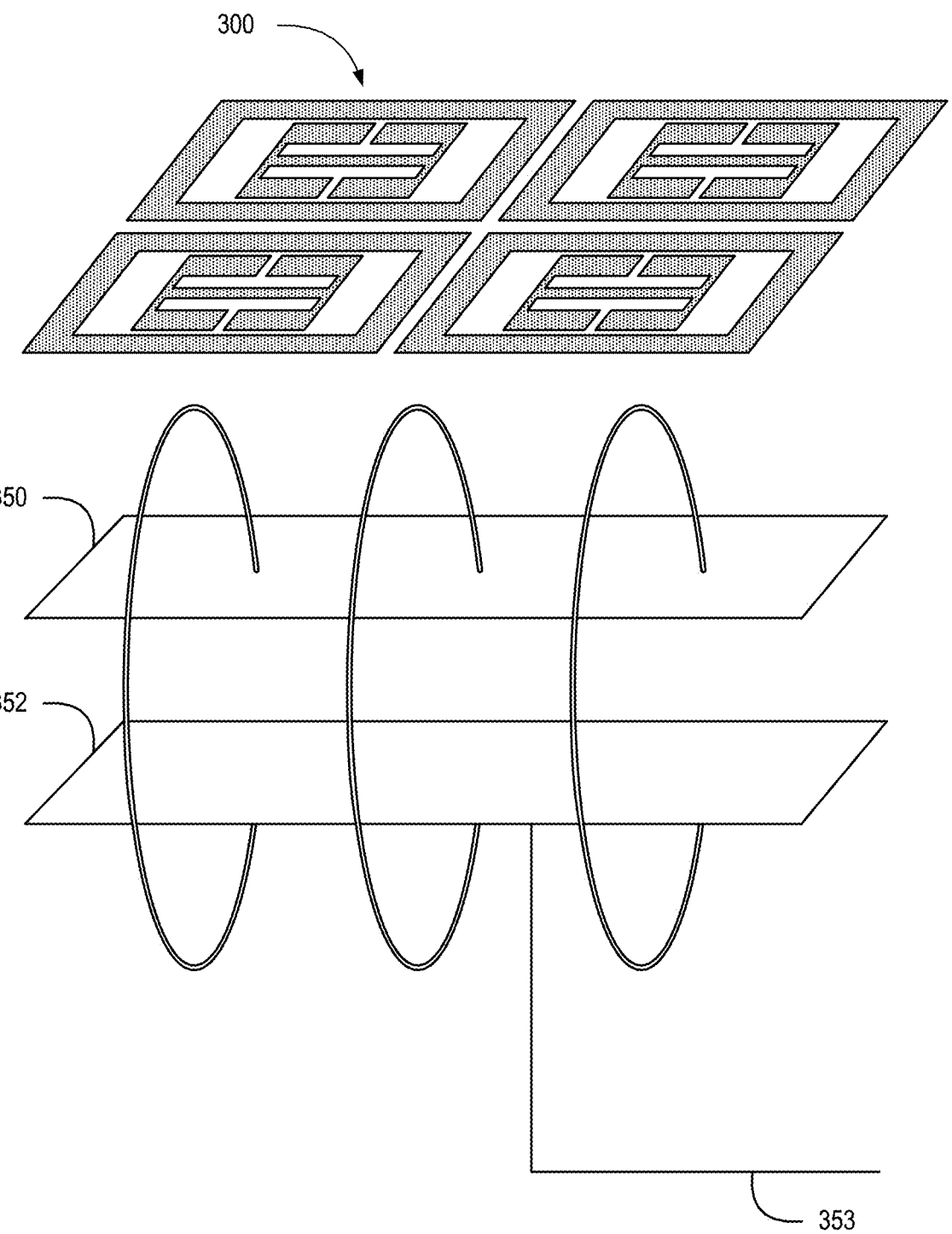
FIG. 3 illustrates a simplified example of four electromagnetic resonator elements associated with a single capacitive element, according to one embodiment.

FIG. 3 illustrates a simplified example of four electromagnetic resonator elements 300 associated with a single capacitive element (plates 350 and 352 held in place by three rings). A single control input 353 may apply a physical stimulus to the capacitive element (e.g., to the plate(s) themselves or to the rings) to modify the capacitive value thereof. Modifying the capacitive value of the capacitive element affects the resonance properties of all four of the electromagnetic resonator elements 300.

Figure 4:
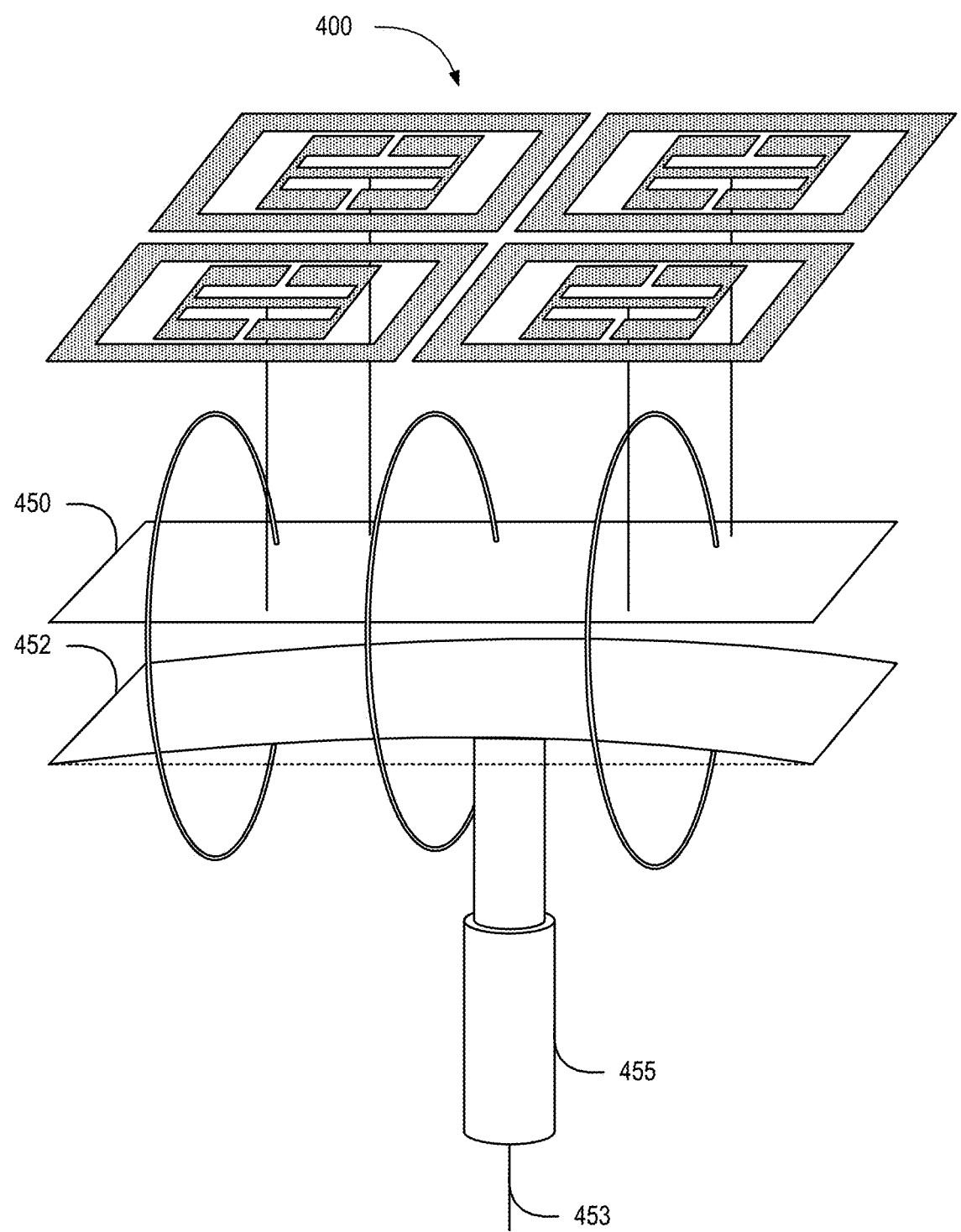
FIG. 4 illustrates an example embodiment in which the control input causes a piston to bend a plate of a capacitive element, according to one embodiment.

FIG. 4 illustrates an example embodiment in which a control input 453 causes a piston to bend or otherwise mechanically deform a plate 452 of a capacitive element. The distance between the plates 450 and 452 affects the capacitance of the capacitive element. The change in capacitance affects the resonant properties of each of the four electromagnetic resonator elements in the subset 400 of resonator element.

Figure 5:
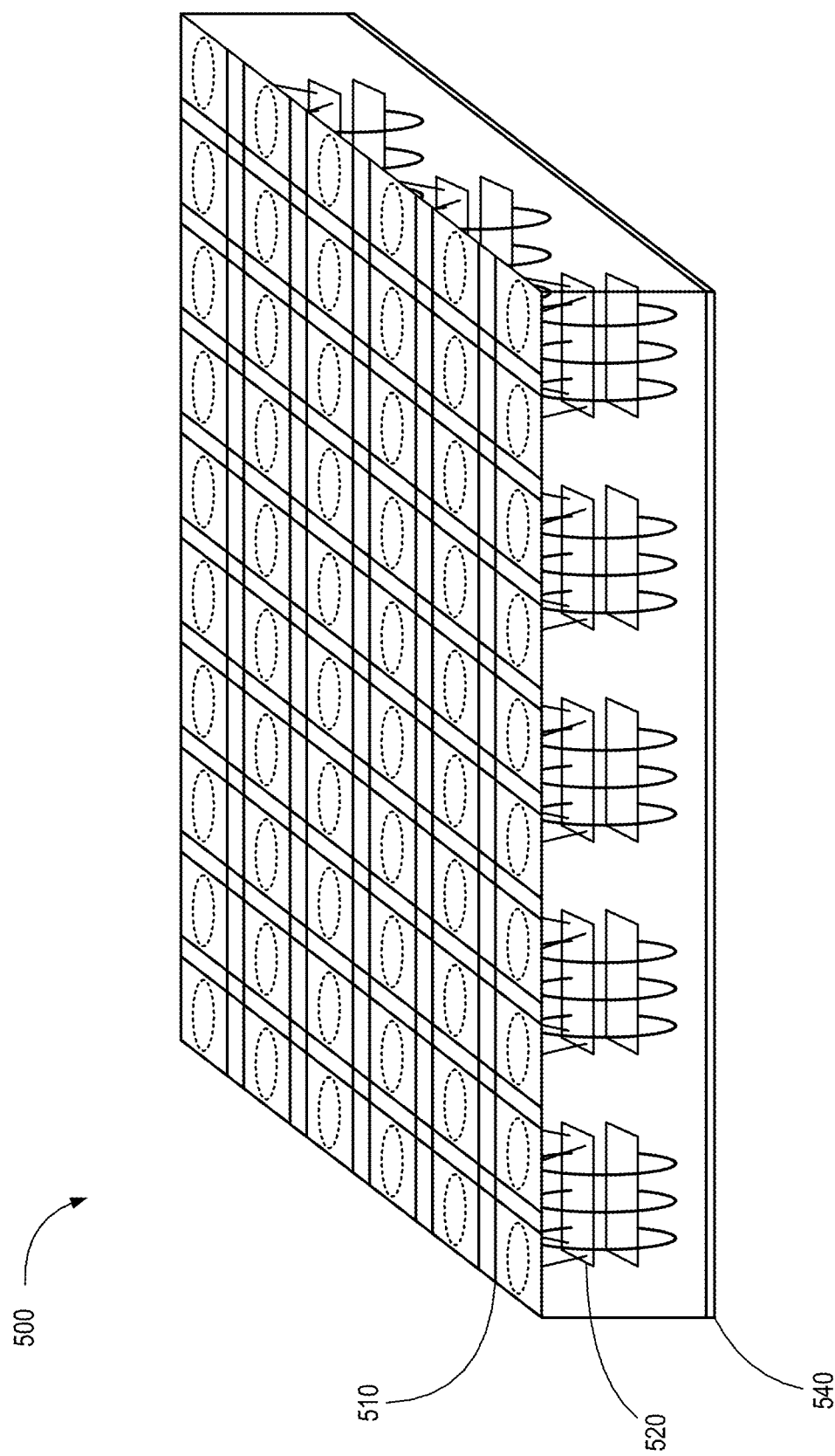
FIG. 5 illustrates an example of a system that includes a plurality of subsets of resonator elements, according to one embodiment.

FIG. 5 illustrates an example of a system 500 that includes a plurality of subsets of resonator elements 510. Each subset includes multiple resonator elements 510 that are commonly associated with a single capacitive element 520. A feed 540 may feed a common signal to all the resonator elements 510.

Figure 6:
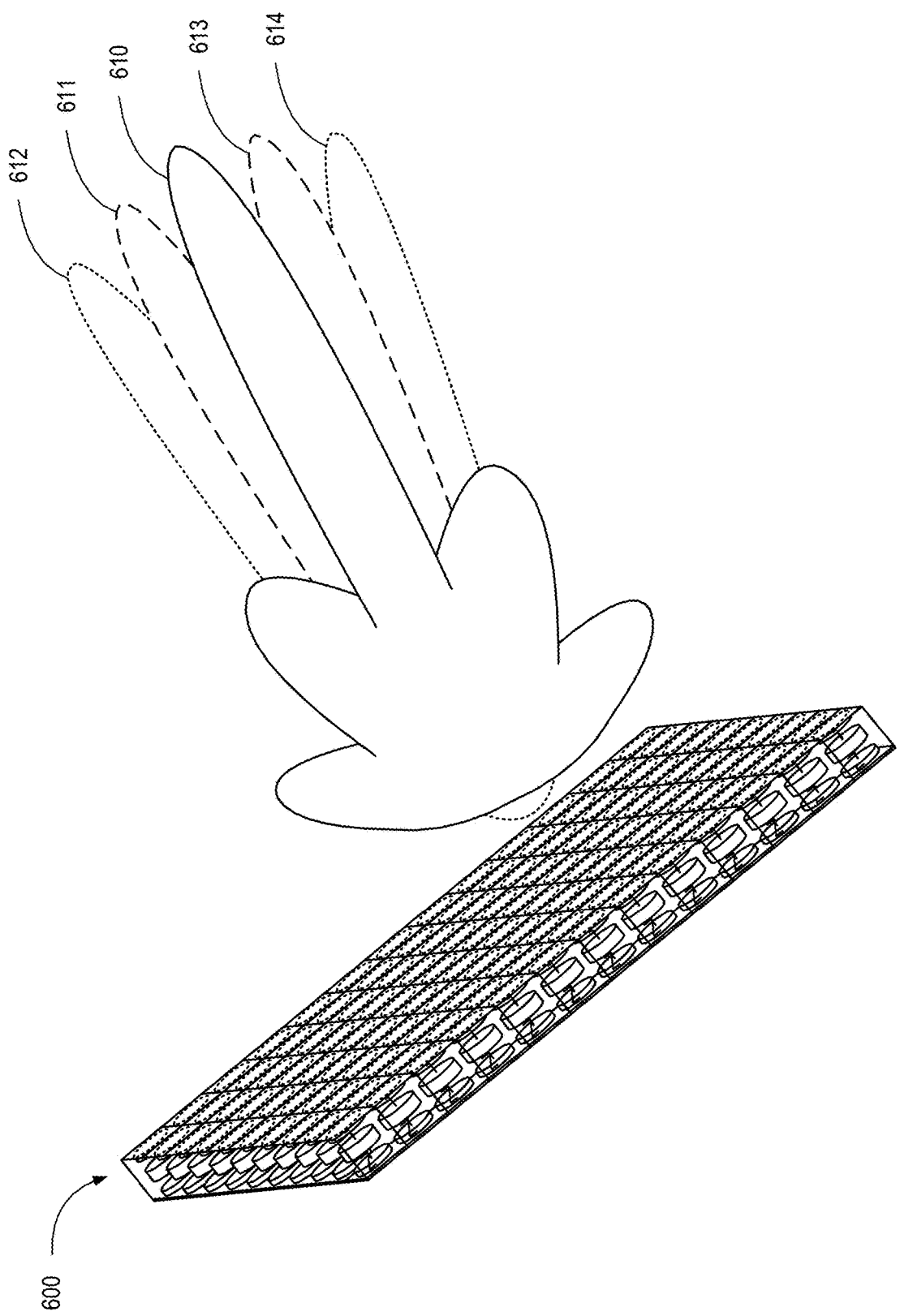
FIG. 6 illustrates, a system representative of any of the various embodiments described herein to produce beamforms at various steering angles, according to various embodiments.

FIG. 6 illustrates, a system 600 representative of any of the various embodiments described herein. The system 600 can produce various beamforms at various steering angles, as illustrated by beamforms 610-614.

FIG. 7A illustrates an electromagnetic antenna system 710 configured with subsets of resonator elements according to any of the various embodiments described herein configured to selectively steer a beamform within a coverage area 720. As described herein, the number of control inputs may be equal to the number of subsets of resonator elements. Since each subset of resonator elements may include many resonator elements, the number of control inputs may be significantly less than the number of resonator elements.

Figure 7B:
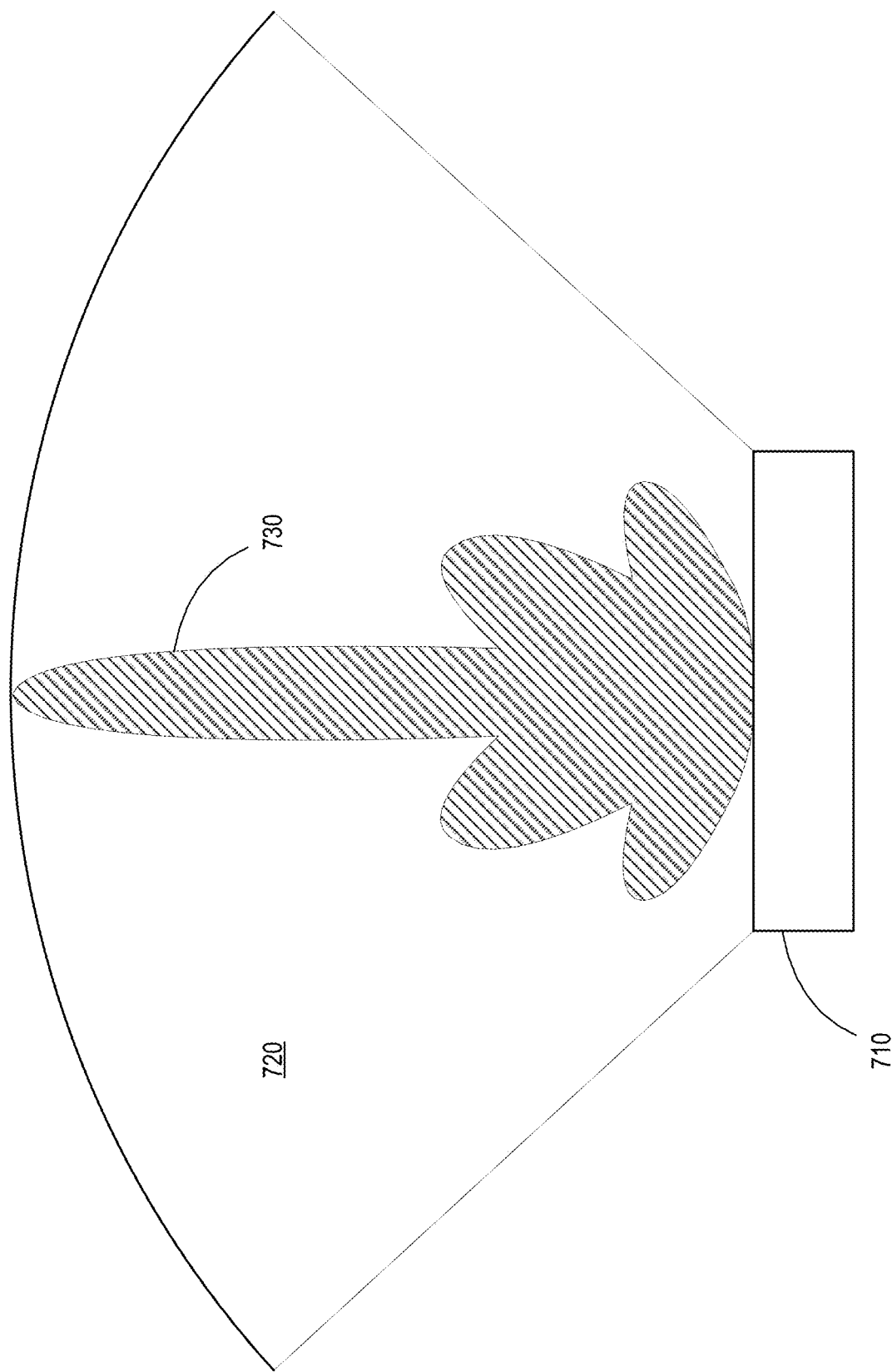
FIG. 7B illustrates a high-directivity beamform that can be steered within the coverage area, according to one embodiment.

FIG. 7B illustrates a high-directivity beamform 730 that can be steered within the coverage area 720 by the system 710.

Figure 7C:
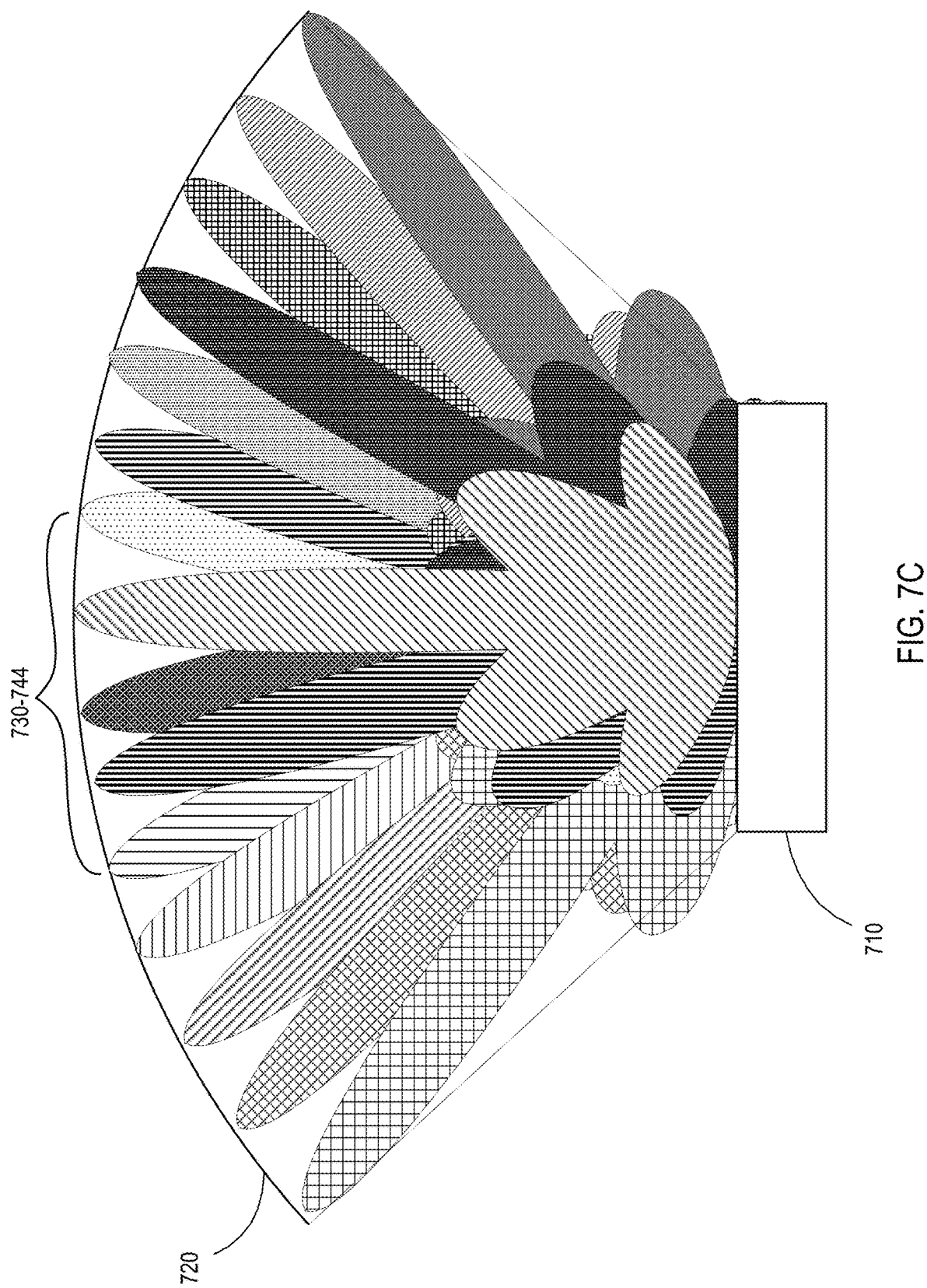
FIG. 7C illustrates various selectable beamforms that may be selectively generated by the system to serve a coverage area, according to one embodiment.

FIG. 7C illustrates various selectable beamforms 730-744 that may be selectively generated by the system 710 to serve the entire coverage area, 720. In embodiments using the phase-toggle techniques discussed herein, each unique beamform may be selected by applying a particular voltage that causes some resonator elements to operate at a first phase angle and other resonator elements to operate at a second phase angle. A finite number of field patterns (i.e., beamforms 730-744) can be used to serve the coverage area 720.

In some embodiments, a beam with a maximum possible directivity, for an aperture of a given size may be swept through a coverage zone. The coverage area may be defined in three-dimensional space and require sweeping the beam in two directions. In other embodiments, the beam may be two-dimensionally steered and maintain a constant or steering-angle-dependent beamwidth in the other dimension. For example, a coverage area may be defined as a conical sector of three-dimensional space extending from the system with a solid angle, $\Omega_c$. The beamwidth, $\Omega_b$, produced by the system with a maximum possible directivity is a function of the aperture size and the Friis directivity.

The beamwidth of such a system can be expressed as:

$$\Omega_b = \frac{4\pi}{D} = \frac{\lambda^2}{A} \qquad \text{Equation 1}$$

In Equation 1, A is the aperture area of the resonator elements in the collective subsets of resonator elements, $\lambda$ is the wavelength of a frequency within an operational bandwidth, and D is the maximum directivity. A beam with a beamwidth, $\Omega_b$, generated by a system can be moved or steered around a conical coverage area having a solid angle, $\Omega_c$. The system can service the conical coverage area as long as it can produce a sufficient number of distinct field patterns, $N_p$, to serve the entire coverage area. Assuming each field pattern, $N_p$, can be tailored to serve a unique portion of the conical coverage area defined by the solid angle, $\Omega_c$, the minimum number of field patterns can be expressed as:

$$N_p = \Omega_c/\Omega_b \qquad \text{Equation 2}$$

Figure 8A:
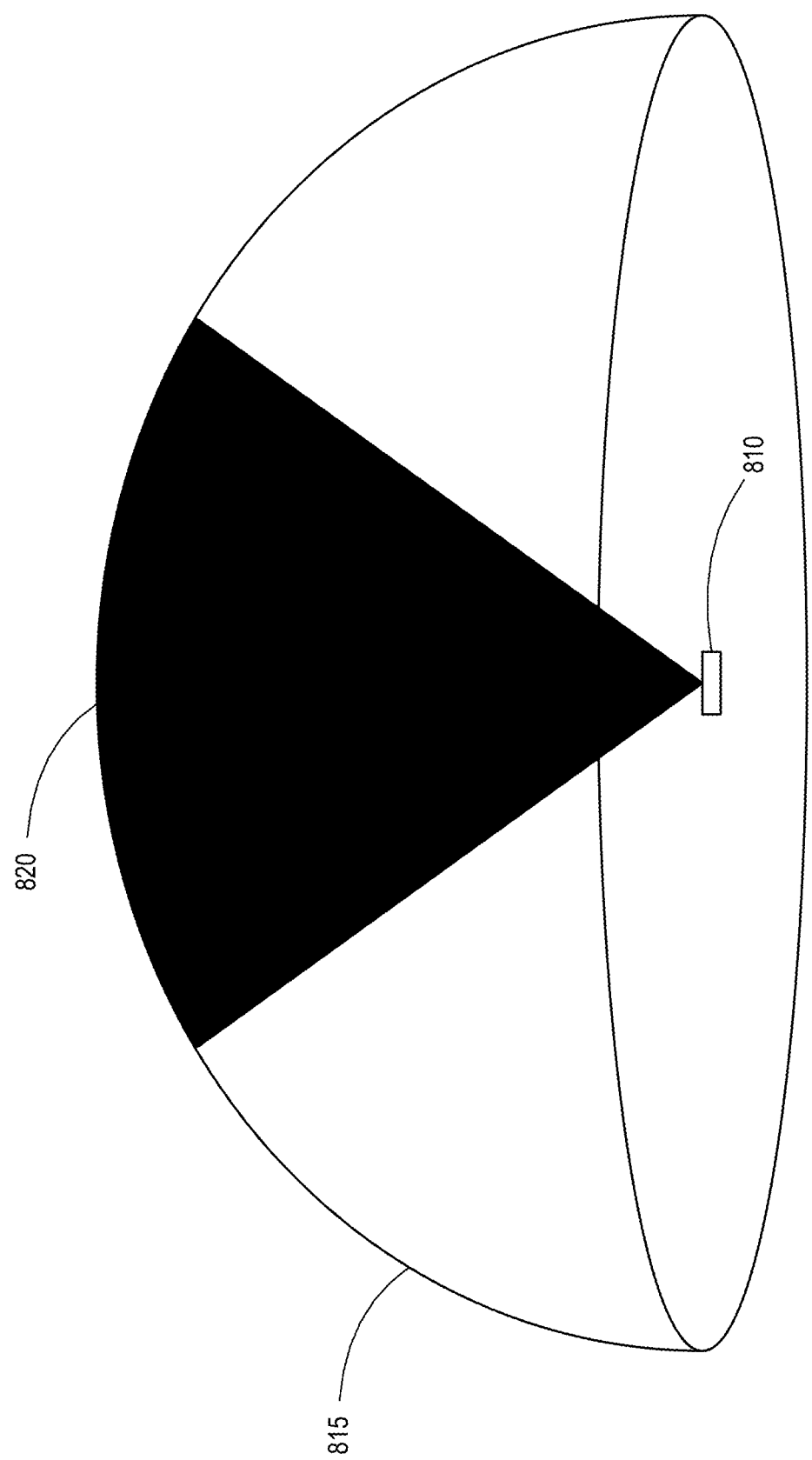
FIG. 8A illustrates a simplified diagram of a potential three-dimensional coverage area of an electromagnetic or acoustic system, according to various embodiments.

FIG. 8A illustrates a simplified diagram 800 of a potential three-dimensional coverage area 820 of an electromagnetic or acoustic system 810 within a three-dimensional space 815, according to one embodiment.

Figure 8B:
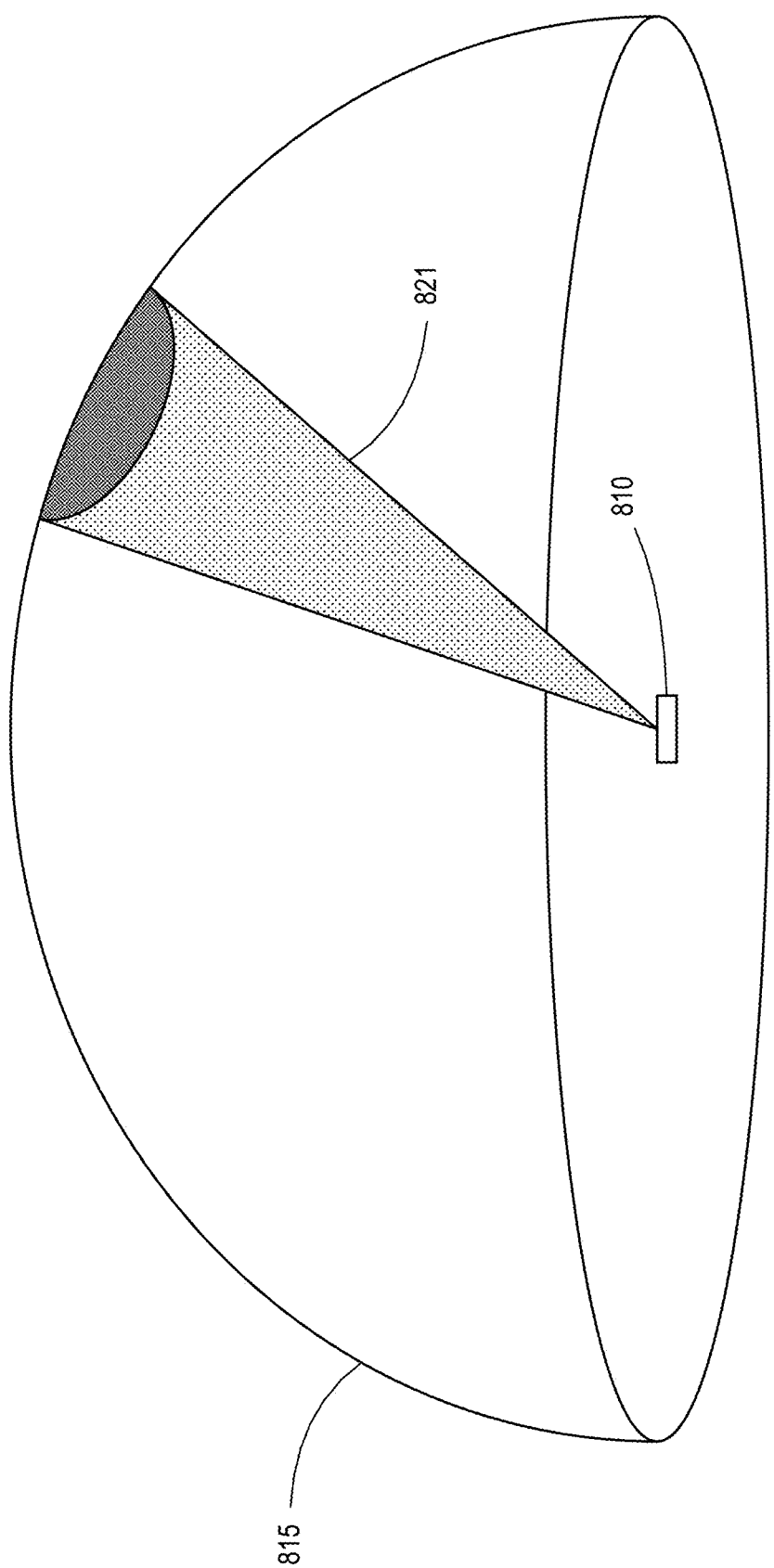
FIG. 8B illustrates a simplified diagram with a conical field pattern generated by the system within the three-dimensional space, according to one embodiment.

FIG. 8B illustrates the simplified diagram 800 with a conical field pattern 810 generated by the system 810 within the three-dimensional space, according to one embodiment.

Figure 8C:
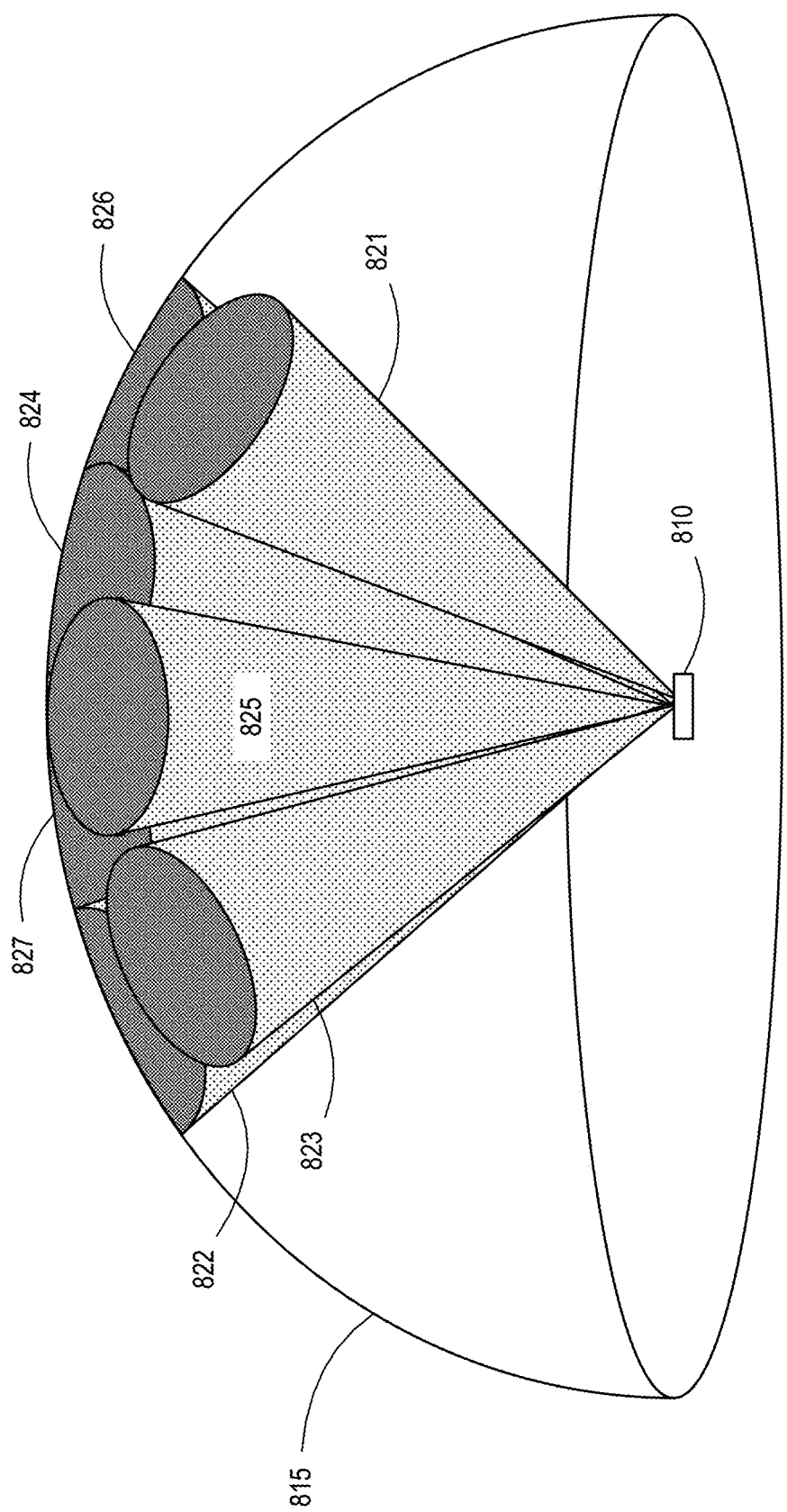
FIG. 8C illustrates a finite number of conical field patterns selectively generated by the system to serve the three-dimensional coverage area, according to one embodiment.

FIG. 8C illustrates a finite number of conical field patterns 821-827 that can be selectively generated by the system 810 to serve the three-dimensional coverage area (820, FIG. 8A) within the three-dimensional space 815, according to one embodiment. As can be appreciated, as the directivity of the system 810 increases, the beamwidth, 14, will decrease and the number of beamforms or radiation patterns necessary to serve the entire coverage area will increase. The number of uniquely controllable subsets of resonator elements (and the number of resonator elements in each subset) may be selected to attain a target directivity and coverage area. In some embodiments, a minimum number of subsets for a target directivity and coverage area may be used to minimize the number of control inputs and the associated cost and/or complexity.

Figure 9:
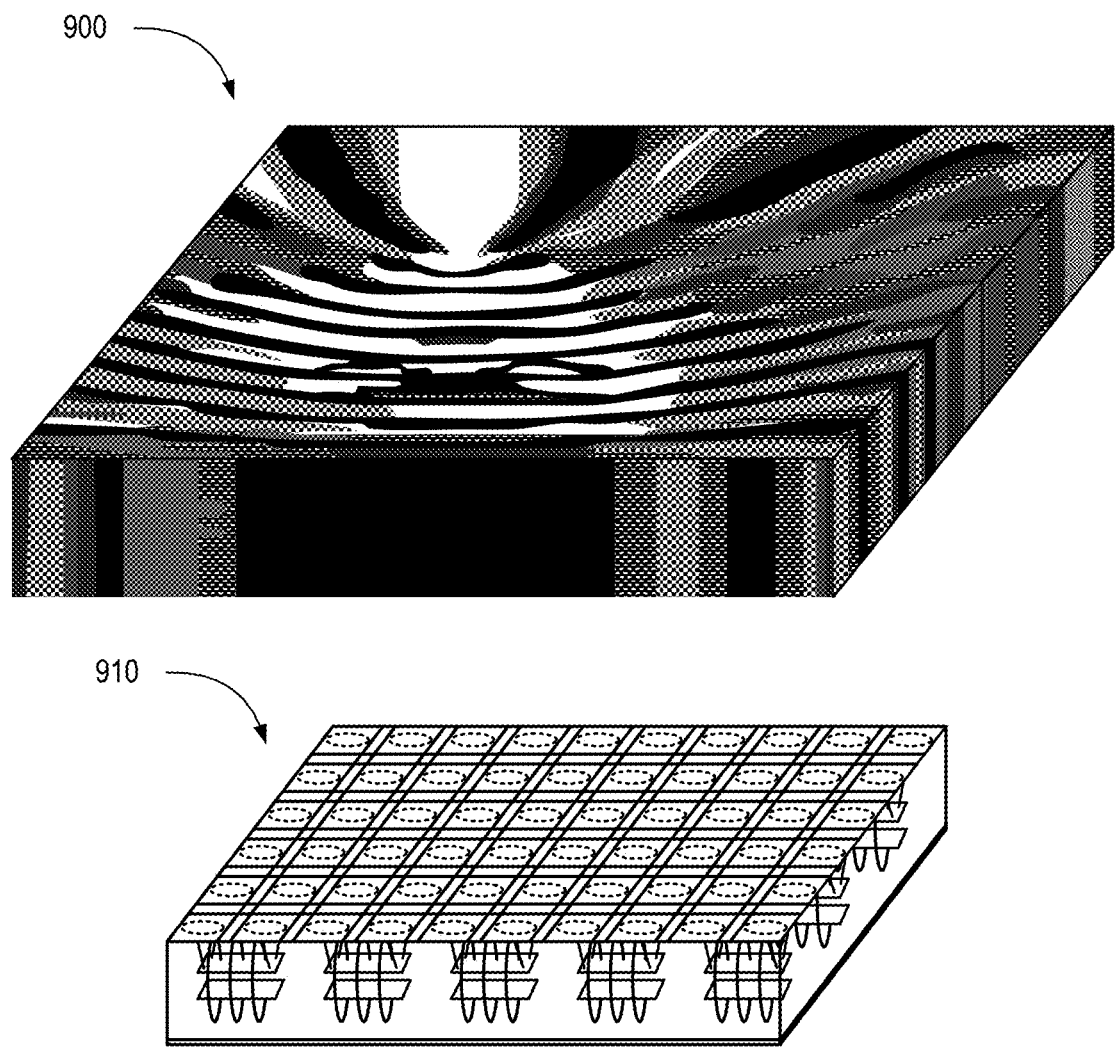
FIG. 9 illustrates a diffractive structure to modify the beamforms generated by an acoustic or electromagnetic system, according to one embodiment.

FIG. 9 illustrates a diffractive structure, such as a holographic lens or precoder, to modify the beamforms generated by an acoustic or electromagnetic system 910. The diffractive structure 900 may have an aperture larger than the system 910 and focus incident acoustic and/or electromagnetic radiation to only part of the system 910. The diffractive structure may, for example, be formed as a plurality of discrete subwavelength voxels of varying dielectric constants (in electromagnetic embodiments) or acoustic properties such as density, bulk modules, etc. (in acoustic embodiments). In some embodiments, metamaterials may be utilized to include dielectric constants below 1 for an operational bandwidth.

Figure 10A:
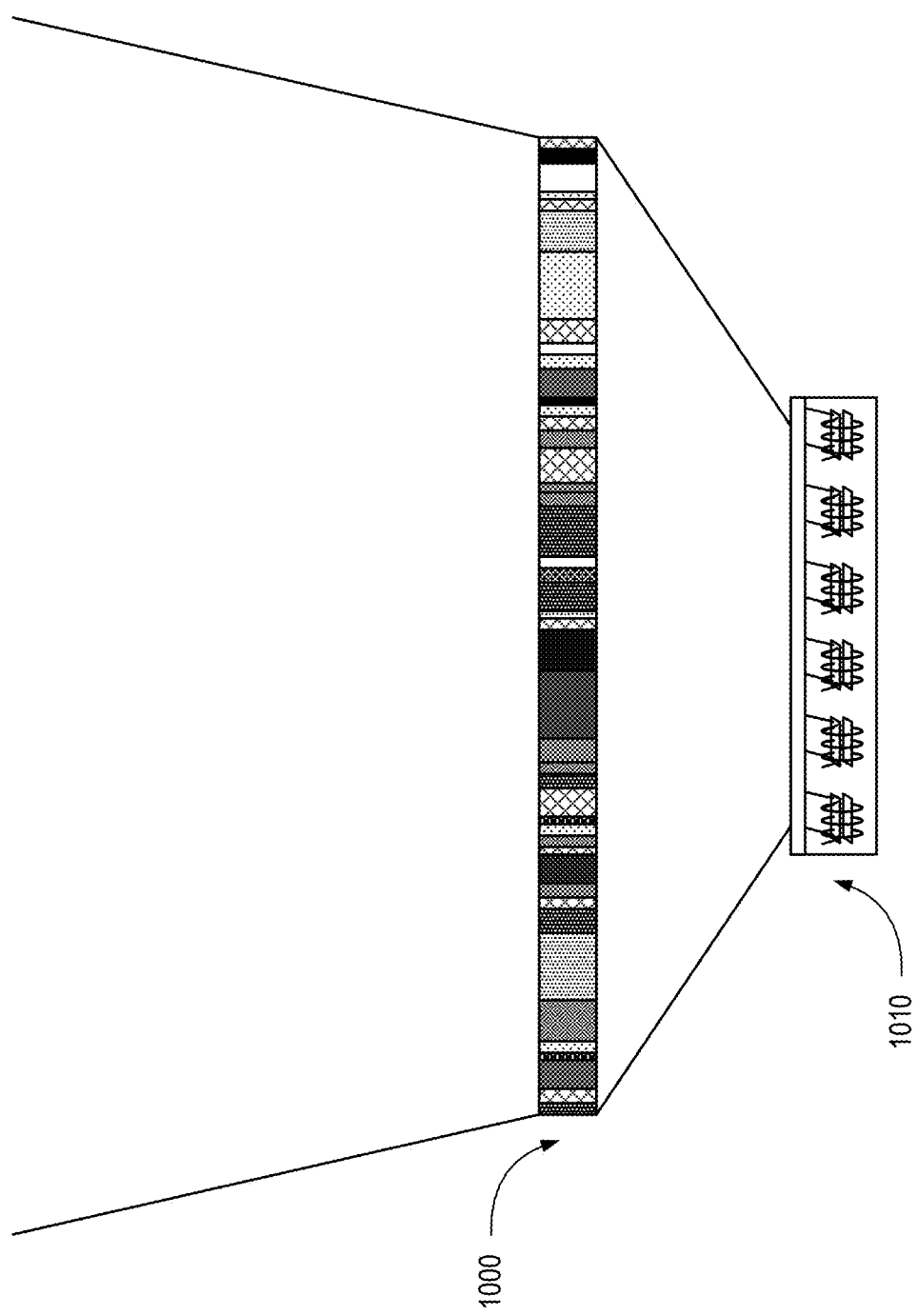
FIG. 10A illustrates a diffractive structure focusing incident radiation to a sub-portion or reduced aperture of the system of subsets of resonator elements, according to one embodiment.

FIG. 10A illustrates a diffractive structure 1000 focusing incident radiation to a sub-portion or reduced aperture of the system of subsets of resonator elements.

FIG. 10B illustrates an acoustic diffractive structure 1001 mapping acoustic radiation to an acoustic system 1015 comprises acoustic resonator elements, according to one embodiment. In some embodiments, the acoustic system 1015 may comprise a plurality of subsets of acoustic resonator elements, as described in conjunction with other embodiments herein.

Figure 10C:
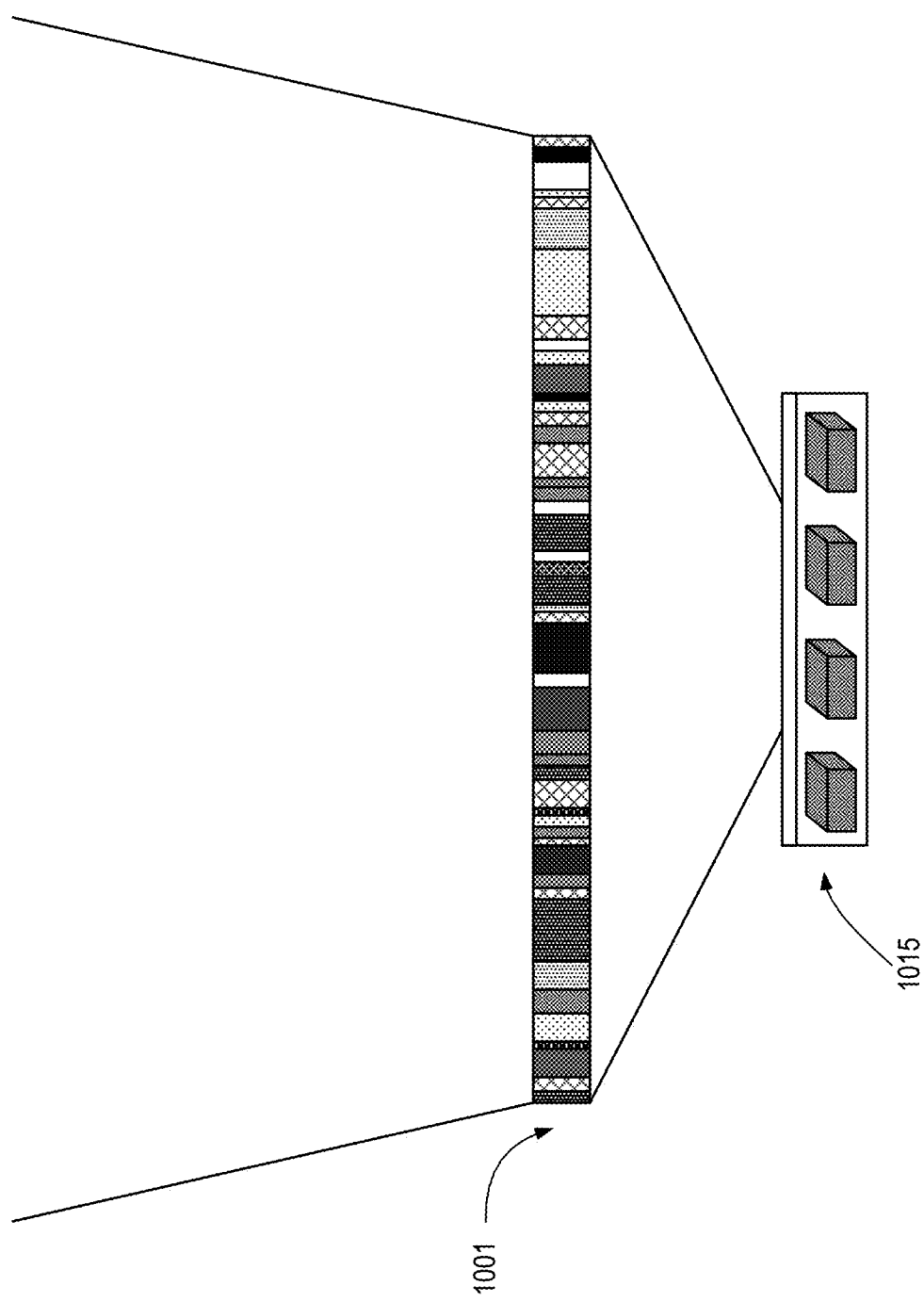
FIG. 10C illustrates an acoustic diffractive structure functioning as an acoustic diffractive concentrator, according to one embodiment.

FIG. 10C illustrates the acoustic diffractive structure 1001 functioning as an acoustic diffractive concentrator, according to one embodiment. The acoustic diffractive structure may concentrate acoustic radiation to a sub-portion of the acoustic system 1015. The acoustic diffractive structure 1001 may be embodied as an acoustically-transmissive structure with a three-dimensional distribution of acoustic refractive indices to diffractively concentrate acoustic waves incident on an effective aperture of the acoustic diffractive structure 1015 to a smaller effective aperture on the acoustic system 1015.

The acoustic diffractive structure 1001 may be used with other acoustic transmitters, receivers, and/or transceivers other than the acoustic system 1015 described herein. For example, the acoustic diffractive structure 1001 may be used with an acoustic transducer or array of acoustic transducers. An acoustic diffractive structure 1001 may concentrate acoustic radiation to a smaller effective aperture corresponding to an acoustic receiving area of at least one transducer. The acoustic diffractive structure 1001 may diffractively inverse-concentrate acoustic waves from the at least one transducer for propagation or from an acoustic system 1015 as described herein.

The acoustic diffractive structure 1001 may diffractively concentrate incident acoustic waves received between a minimum acceptance angle and a maximum acceptance angle to the smaller effective aperture. In some embodiments, the minimum acceptance angle is substantially orthogonal to the effective aperture of the structure (zero degrees). The maximum acceptance angle is defined between zero degrees and the theoretical maximum acceptance angle defined as $$\sin^{-1}\left(\sqrt{\frac{\Sigma}{S}}\right),$$

where S is an area of the effective aperture of the structure and $\Sigma$ is an area of the effective aperture of the array of acoustic antenna elements. The maximum acceptance angle may be approximately one-half of the theoretical maximum acceptance angle. In some embodiments, the maximum acceptance angle may be set as approximately one-quarter of the theoretical maximum acceptance angle.

The three-dimensional distribution of acoustic refractive indices may be a numerically optimized distribution of acoustic refractive indices. The distribution may be numerically shape-optimized and/or numerically thickness-optimized. The acoustic diffractive structure 1001 may partially reflect some acoustic waves as part of the concentrating and/or to control or modify the transmissive bandwidth.

Acoustic diffractive structures may be adapted and configured for audible frequencies or ultrasonic frequencies, such as those used for imaging. Metamaterials may be utilized to achieve effective acoustic refractive indices for an operational bandwidth that might otherwise be unattainable. In some embodiments, the acoustic diffractive structure 1001 may comprise a distribution of acoustic refractive indices discretized as a plurality of voxels to form the structure.

The concept of etendue is useful to characterize the concentration that can be achieved with a diffractive concentrator structure. Etendue, otherwise known as acceptance, throughput, or collecting power, is infinitesimally defined as $dG=n^2 dS \cos\theta \, d\Omega$, where $dS$ is an infinitesimal surface element in a medium of refractive index n, receiving light within a solid angle $d\Omega$ with an incidence angle $\theta$. Etendue is conserved in lossless systems, including in diffractive systems such as those described herein. Scattering and absorption can increase etendue but does not decrease it. Ideal concentration maintains etendue as low as possible.

Conservation of etendue imposes a theoretical limit on the maximum concentration factor that can be achieved in an acoustic diffractive system. The relatively large aperture of the acoustic diffractive structure 1001 receives or transmits radiation within a cone of opening angle $2\alpha$, i.e. the large aperture has an acceptance angle $\alpha$. The underlying electroacoustic transducer(s) and/or acoustic system 1015 may represent a relatively small aperture that transmits or receives acoustic radiation within a cone having an opening angle $2\beta$. In such an embodiment, the etendue of the radiation at the large aperture is $G_1=\pi S \sin^2\alpha$, where S is the area of the large aperture. The etendue of the radiation at the small aperture is $G_2=\pi\Sigma \sin^2\beta$, where $\Sigma$ is the area of the small aperture. Conservation of etendue $G_1=G_2$ is described in Equation 3 below.

$$C = \frac{S}{\Sigma} = \frac{\sin^2\beta}{\sin^2\alpha} \qquad \text{Equation 3}$$

In Equation 3, C is the concentration of the acoustic diffractive structure (i.e., the acoustic concentrator). For a given acceptance angle $\alpha$, the concentration will be a maximum for the maximum value of $\beta$, i.e. 90°. Accordingly, the theoretical maximum concentration is $C_{max}=1/\sin^2\alpha$. Alternatively, for a given concentration factor C, the theoretical maximum acceptance angle is $\alpha_{max}=\sin^{-1}(1/\sqrt{C})$. For example, a concentration factor C=16 corresponds to a theoretical maximum acceptance angle $\alpha_{max}\sim 14°$.

Figure 11A:
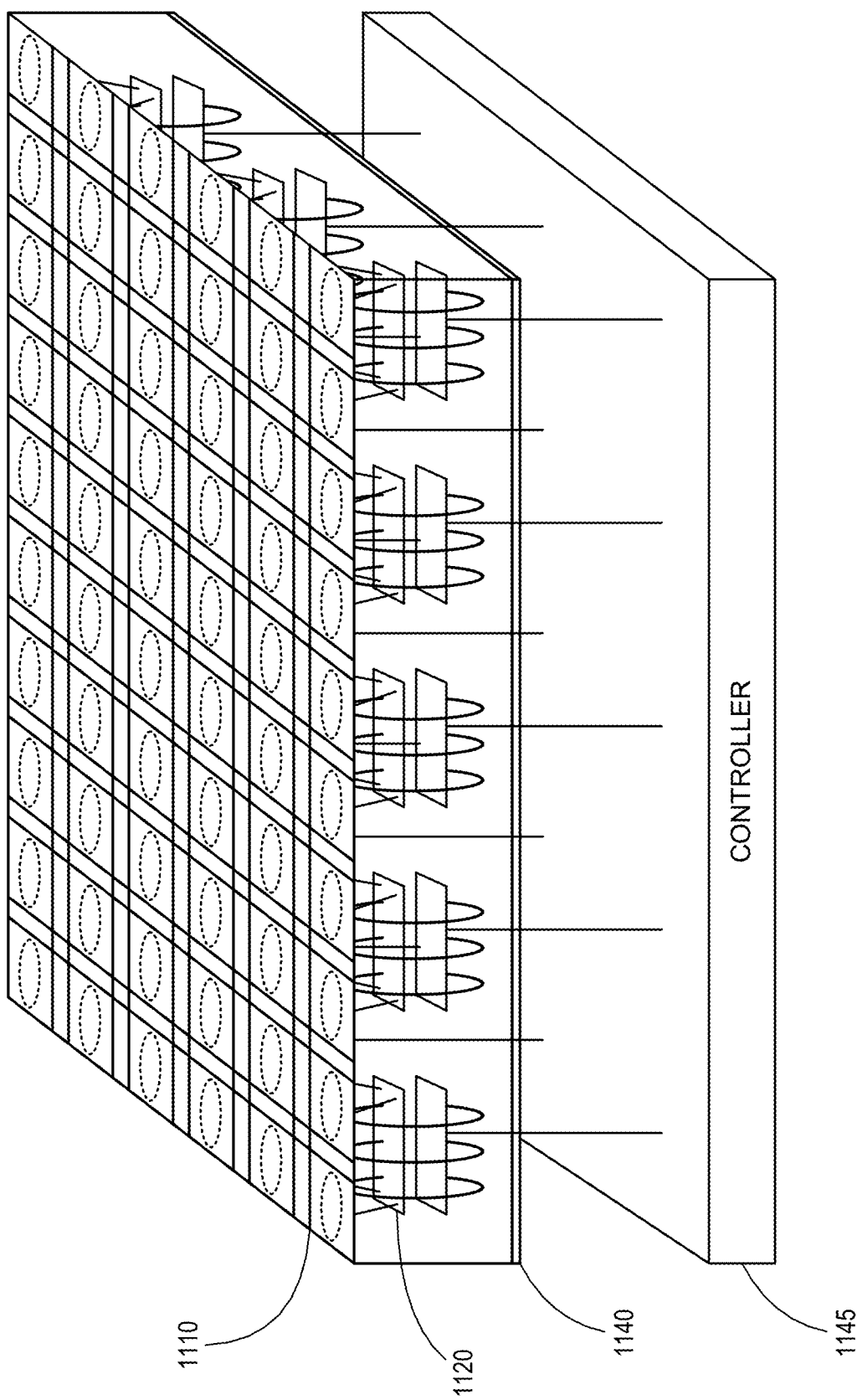
FIG. 11A illustrates a controller that selectively applies physical stimulus values to capacitive elements that are each associated with a subset of resonator elements.

FIG. 11A illustrates a controller 1145 that selectively applies physical stimulus values to capacitive elements 1120 that are each associated with a subset of resonator elements 1110. Each unique pattern of applied physical stimulus values corresponds to a unique pattern of resonance properties of the resonator elements 1110. Each given pattern of resonance properties corresponds to a unique beam form and/or steering angle between freespace 1100 and the feed 1140. While capacitive elements 1120 for an electromagnetic embodiment are illustrated, it is appreciated that acoustically modifiable elements with modifiable densities, bulk moduli, or the like may be utilized in acoustic embodiments.

In embodiments whether the physical stimulus comprises a voltage value, it may be feasible to selectively pick voltage values that are not contiguous on a number line. However, for physical stimuli such as thermal physical stimuli, pressure, or mechanical deformation, it may be preferable or more feasible to sweep the physical stimulus value from a first value to a final value.

Figure 11B:
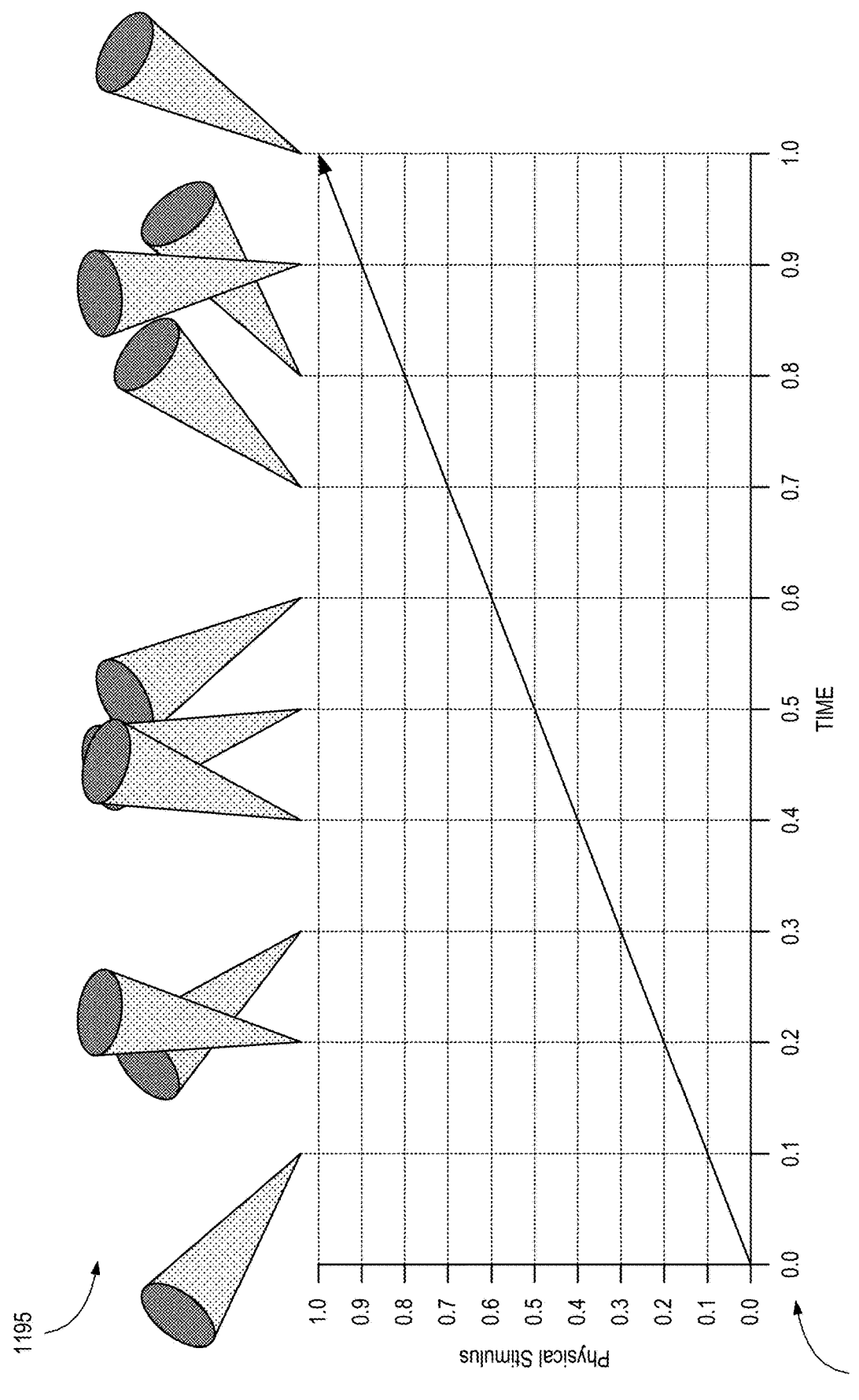
FIG. 11B illustrates an embodiment of a system in which sweeping the physical stimulus value from an initial value to a final value generates a plurality of unique beamforms at different steering angles, according to one embodiment.

FIG. 11B illustrates an embodiment of a system in which sweeping the physical stimulus value from a normalized initial value of 0 to a normalized final value of 1 (as shown in graph 1190) generates a plurality of unique beamforms 1195 at different steering angles. While this may be suitable for some applications, it may be desirable to have a system in which sweeping one or more physical stimulus values causes the system to generate a specific pattern of beamforms and/or steering angles—as opposed to the arbitrary order of beamforms 1195 and steering angles above the graph.

Figure 11C:
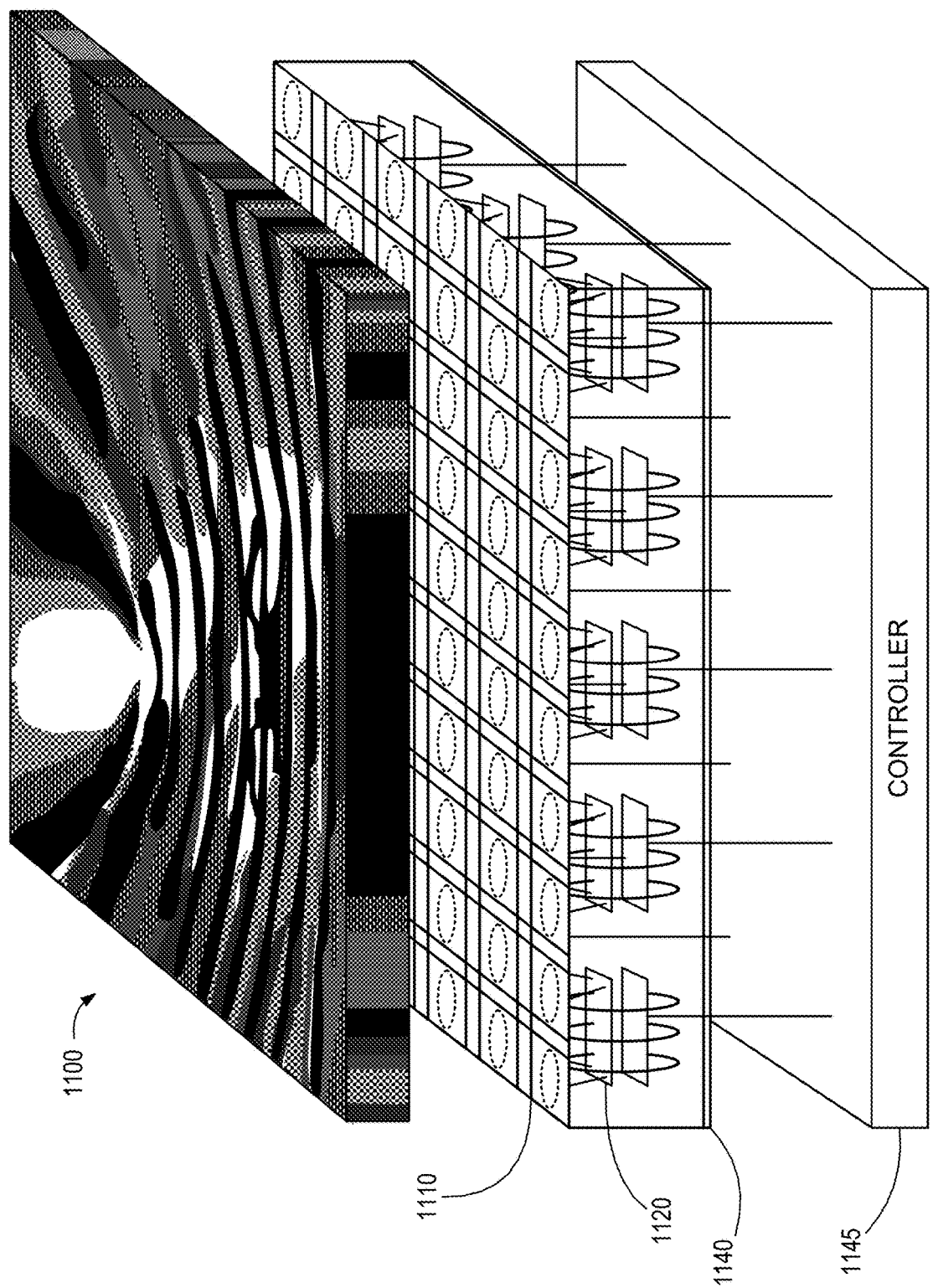
FIG. 11C illustrates a diffractive structure positioned above the electromagnetic system of subsets of resonator elements connected to the common capacitive elements, as described in conjunction with FIG. 11A.

FIG. 11C illustrates a diffractive structure 1100 positioned above the electromagnetic system of subsets of resonator elements 1100 connected to the common capacitive elements 1120, as described in conjunction with FIG. 11A. The diffractive structure 100 may have a volumetric distribution of dielectric constants specifically selected to modify the arbitrary beamforms generated by sweeping a physical stimulus value into a sequence of beamforms conforming to a target sequence of beamforms (e.g., a raster scan of a three-dimensional space or other pattern of beamforms).

Figure 11D:
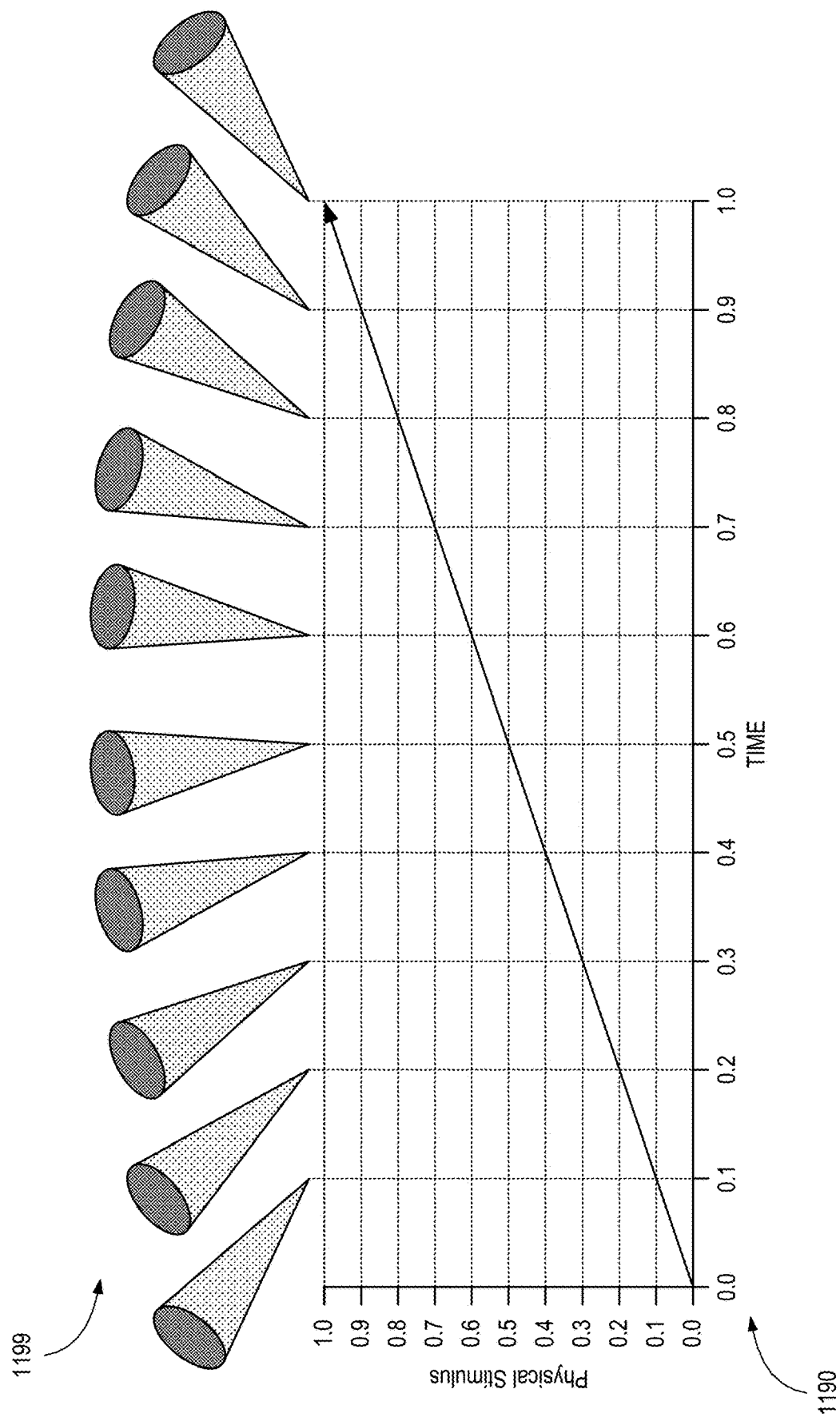
FIG. 11D illustrates an example of a system with a diffractive structure to modify initially generated beamforms to target beamforms when sweeping the physical stimulus value from the initial value to the final value, according to one embodiment.

FIG. 11D illustrates an example of a system using a diffractive structure to ensure that sweeping the physical stimulus value from a normalized initial value of 0 to a normalized final value of 1 (as shown in graph 1190), as described in conjunction with FIG. 11B, results in a target pattern of beamforms 1199 conforming to a target sequence of steering angles.

It is appreciated that the specific examples described herein in the context of one type of radiation (electromagnetic or acoustic) may be adapted for the other type of radiation. The systems described herein may be used for data communication, wireless power transfer, imaging, or any of a wide variety of alternative applications that make use of beamforming acoustic or electromagnetic energy. The system may, for example, be part of a multiple input, multiple output (MIMO) system.

Many existing computing devices and infrastructures may be used in combination with the presently described systems and methods. Some of the infrastructure that can be used with embodiments disclosed herein is already available, such as general-purpose computers, computer programming tools and techniques, digital storage media, and communication links. A computing device or controller may include a processor, such as a microprocessor, a microcontroller, logic circuitry, or the like.

A processor may include a special-purpose processing device, such as application-specific integrated circuits (ASIC), programmable array logic (PAL), programmable logic array (PLA), programmable logic device (PLD), field programmable gate array (FPGA), or other customizable and/or programmable device. The computing device may also include a machine-readable storage device, such as non-volatile memory, static RAM, dynamic RAM, ROM, CD-ROM, disk, tape, magnetic, optical, flash memory, or other machine-readable storage medium. Various aspects of certain embodiments may be implemented using hardware, software, firmware, or a combination thereof.

This disclosure has been made with reference to various exemplary embodiments, including the best mode. However, those skilled in the art will recognize that changes and modifications may be made to the exemplary embodiments without departing from the scope of the present disclosure.

While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

In the description above, various features are sometimes grouped together in a single example, figure, or description thereof for the purpose of streamlining the disclosure. This method of disclosure, however, is not to be interpreted as reflecting an intention that any claim now presented or presented in the future requires more features than those expressly recited in that claim. Rather, it is appreciated that inventive aspects lie in a combination of fewer than all features of any single foregoing disclosed example. The claims are hereby expressly incorporated into this Detailed Description, with each claim standing on its own as a separate example. This disclosure includes all permutations and combinations of the independent claims and their dependent claims.

What is claimed is:

1. A beamforming system, comprising:
    a plurality of subsets of tunable resonator elements arranged on a substrate, wherein each subset of the tunable resonator elements comprises at least two tunable resonator elements that have a common resonance property modifiable by a common physical stimulus, including a first common physical stimulus;
    a first control input to provide the first common physical stimulus to modify the resonance property of all the tunable resonator elements in a first subset of the tunable resonator elements; and
    a controller to adjust the first common physical stimulus provided via the first control input between a plurality of physical stimulus values, wherein each different physical stimulus value corresponds to one of a plurality of a unique resonance patterns and associated unique radiation patterns,
    wherein the plurality of subsets of tunable resonator elements are arranged with subwavelength inter-element spacing in a two-dimensional array at an operational frequency.

2. The beamforming system of claim 1, further comprising a unique control input for each subset of the tunable resonator elements, and wherein the controller is configured to provide a unique physical stimulus to each subset of the tunable resonator elements, where the number of unique control inputs is less than half the number of tunable resonator elements.

3. The beamforming system of claim 1, wherein the first common physical stimulus comprises at least one applied electric voltage.

4. The beamforming system of claim 3, wherein the controller is configured to apply a sequence of electric voltage values to produce a corresponding sequence of radiation patterns.

5. The beamforming system of claim 1, wherein each of the tunable resonator elements is associated with a capacitor with a mechanically deformable material between first and second conductive layers thereof.

6. The beamforming system of claim 1, wherein the first control input comprises at least one transducer to cause mechanical deformation of an element of one or more of the tunable resonator elements in the first subset of tunable resonator elements to change a resonance property thereof.

7. The beamforming system of claim 1, wherein the substrate comprises a capacitive substrate, and wherein the first control input provides the first common physical stimulus to modify a capacitance of the substrate.

8. The beamforming system of claim 7, wherein the first control input provides the first common physical stimulus to modify the capacitance of the substrate via one or more of an electrical input, a thermal input, a mechanical input, and an ultrasonic input.

9. The beamforming system of claim 1, wherein the tunable resonator elements are arranged on the substrate in concentric rings.

10. The beamforming system of claim 1, wherein the tunable resonator elements comprise elements with acoustic resonances.

11. A beamforming system, comprising:
    a plurality of subsets of tunable resonator elements arranged on a substrate, wherein each subset of the tunable resonator elements comprises at least two tunable resonator elements that have a common resonance property modifiable by a common physical stimulus, including a first common physical stimulus;
    a first control input to provide the first common physical stimulus to modify the resonance property of all the tunable resonator elements in a first subset of the tunable resonator elements; and
    a controller to adjust the first common physical stimulus provided via the first control input between a plurality of physical stimulus values, wherein each different physical stimulus value corresponds to one of a plurality of a unique resonance patterns and associated unique radiation patterns,
    wherein the plurality of subsets of tunable resonator elements are arranged with subwavelength inter-element spacings in a one-dimensional array at an operational frequency.

12. The beamforming system of claim 11, further comprising a unique control input for each subset of the tunable resonator elements, and wherein the controller is configured to provide a unique physical stimulus to each subset of the tunable resonator elements, where the number of unique control inputs is less than half the number of tunable resonator elements.

13. A system, comprising:
    a plurality of resonators that are each configured with a unique phase-toggle bias range to:
        operate at a first phase at bias voltages below their respective unique phase-toggle bias range, and
        operate at a second phase at bias voltages above their respective unique phase-toggle bias range;
    a voltage bias input to apply an adjustable bias voltage; and
    a controller to adjust the bias voltage applied by the voltage bias control to select a combination of the plurality of resonators operating at the first phase due to the applied bias voltage being below their respective unique phase-toggle bias ranges, and resonators operating at the second phase due to the applied bias voltage being above their respective unique phase-toggle bias ranges,
    wherein each combination of resonators operating at the first and second phases corresponds to a unique radiation pattern of the resonators.

14. The system of claim 13, wherein the plurality of resonators comprise acoustic resonators.

15. The system of claim 14, wherein the controller adjusts the voltage bias in discrete steps between a first bias voltage value and a second bias voltage value, and
wherein a voltage difference between each of the discrete steps corresponds to a Q factor of the acoustic resonators.

16. The system of claim 15, wherein all the resonators are resonant at the first bias voltage and all the resonators are resonant at the second bias voltage, and wherein sweeping the bias voltage from the first bias voltage value to the second bias voltage in the discrete steps sequentially transitions each resonator from resonant at the first phase to resonant at the second phase.

17. The system of claim 14, further comprising a diffractive structure having an aperture larger than a two-dimensional area of the plurality of acoustic resonators, wherein the diffractive structure is configured to diffractively concentrate incident waves onto at least a portion of the two-dimensional area of the plurality of resonators, and wherein the diffractive structure comprises a three-dimensional distribution of subwavelength features.

18. The system of claim 17, wherein incident waves from angles between zero and a theoretical maximum acceptance angle given by $$\sin^{-1}\left(\sqrt{\frac{\Sigma}{S}}\right),$$

where S is an area of the diffractive structure aperture and $\Sigma$ is the two-dimensional area of the at least a portion of the plurality of resonators, are diffractively concentrated onto at least some of the plurality of resonators.

19. The system of claim 18, wherein incident waves received from angles between approximately one-fourth of the theoretical maximum acceptance angle are diffractively concentrated onto at least two of the plurality of resonators.

20. The system of claim 14, further comprising a static precoder to convert acoustic waves between the unique radiation patterns of the acoustic resonators and a set of target radiation patterns.

21. The system of claim 20, wherein the static precoder and the acoustic resonators are configured to operate within an audible acoustic frequency band.

22. The system of claim 20, wherein the static precoder and the acoustic resonators are configured to operate within a band that includes an audible acoustic frequency band.

23. The system of claim 20, wherein the static precoder and the acoustic resonators are configured to operate within an ultrasonic frequency band.

24. The system of claim 20, wherein the static precoder and the acoustic resonators are configured to operate within an ultrasonic frequency band for medical imaging.

25. The system of claim 20, wherein the static precoder comprises a distribution of materials having varying densities to convert between the unique radiation patterns and the set of target radiation patterns.

26. The system of claim 20, wherein the static precoder comprises a distribution of materials having varying densities to convert between the unique radiation patterns and the set of target radiation patterns for acoustic multiple-Input and Multiple-Output (MIMO) between spatial locations and subsets of the acoustic resonators.

27. The system of claim 26, wherein acoustic waves from each of a plurality of spatial locations with target fields of view to subsets of the acoustic resonators to provide three-dimensional localization of received acoustic waves.

28. The system of claim 13, wherein the plurality of resonators comprise electromagnetic resonators.

29. The system of claim 13, wherein the first phase and the second phase are 180 degrees out of phase.

30. The system of claim 13, wherein the controller adjusts the voltage bias in discrete steps between a first bias voltage value and a second bias voltage value.

31. The system of claim 13, wherein at least two of the unique radiation patterns are linearly independent.

32. The system of claim 13, wherein the controller is configured to implement a beam sequence generator by sweeping the voltage bias between a first voltage and a second voltage.

33. The system of claim 32, wherein sweeping the voltage bias between start and stop voltages comprises a continuous analog voltage sweep between the first and second voltages.

34. The system of claim 32, wherein sweeping the voltage bias between start and stop voltages comprises a discrete stepping of voltage values between the first and second voltages.

35. A system, comprising:
a plurality of resonators that are each configured with a unique phase-toggle threshold range to:
operate at a first phase at stimulus inputs below the phase-toggle threshold range, and
operate at a second phase at stimulus inputs above the phase-toggle threshold range;
a control input to apply an adjustable physical stimulus to the resonators; and
a controller to adjust a magnitude of the physical stimulus to select a combination of the plurality of resonators operating at the first phase due to the applied physical stimulus being below their respective unique phase-toggle threshold ranges, and resonators operating at the second phase due to the applied physical stimulus being above their respective unique phase-toggle threshold ranges,
wherein each combination of resonators operating at the first and second phases corresponds to a unique radiation pattern of the resonators.

36. The system of claim 35, wherein the plurality of resonators comprise acoustic resonators.

37. The system of claim 35, wherein the plurality of resonators comprise electromagnetic resonators.

38. The system of claim 35, wherein the plurality of resonators are configured to operate in a receive mode to receive radiation.

39. The system of claim 35, wherein the plurality of resonators are configured to operate in a transmit mode to transmit radiation.

40. The system of claim 35, wherein the plurality of resonators are configured to operate in a transceiver mode to selectively transmit and receive radiation.

41. The system of claim 35, wherein the first phase and the second phase are 180 degrees out of phase.

42. The system of claim 35, wherein the first phase and the second phase are 180 degrees out of phase.

43. The system of claim 35, wherein the adjustable physical stimulus causes mechanical deformation of a tunable element.

* * * * *